(12) United States Patent
Chiang et al.

(10) Patent No.: US 11,456,368 B2
(45) Date of Patent: Sep. 27, 2022

(54) SEMICONDUCTOR DEVICE STRUCTURE WITH HARD MASK LAYER OVER FIN STRUCTURE AND METHOD FOR FORMING THE SAME

(71) Applicant: Taiwan Semiconductor Manufacturing Co., Ltd., Hsinchu (TW)

(72) Inventors: Kuo-Cheng Chiang, Zhubei (TW); Kuan-Ting Pan, Taipei (TW); Huan-Chieh Su, Changhua County (TW); Shi-Ning Ju, Hsinchu (TW); Chih-Hao Wang, Baoshan Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 37 days.

(21) Appl. No.: 16/547,994

(22) Filed: Aug. 22, 2019

(65) Prior Publication Data

US 2021/0057535 A1    Feb. 25, 2021

(51) Int. Cl.
| | |
|---|---|
| *H01L 29/423* | (2006.01) |
| *H01L 29/78* | (2006.01) |
| *H01L 29/06* | (2006.01) |
| *H01L 29/66* | (2006.01) |
| *H01L 21/308* | (2006.01) |

(52) U.S. Cl.
CPC .... *H01L 29/42392* (2013.01); *H01L 29/0653* (2013.01); *H01L 29/6653* (2013.01); *H01L 29/6681* (2013.01); *H01L 29/66545* (2013.01); *H01L 29/66553* (2013.01); *H01L 29/7853* (2013.01); *H01L 21/308* (2013.01)

(58) Field of Classification Search
CPC ........... H01L 29/42392; H01L 29/0653; H01L 29/6653; H01L 29/66545; H01L 29/66553; H01L 29/6681; H01L 29/7853; H01L 21/308
USPC ........................................................ 257/401
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

(Continued)

*Primary Examiner* — Allen L Parker
*Assistant Examiner* — David W Houston, III
(74) *Attorney, Agent, or Firm* — Birch, Stewart, Kolasch & Birch, LLP

(57) ABSTRACT

A semiconductor device structure is provided. The semiconductor device structure includes a fin structure formed over a substrate, and a hard mask layer formed over the fin structure. The semiconductor device structure also includes a gate structure formed surrounding the hard mask layer and the fin structure, and a portion of the gate structure is interposed between the fin structure and the hard mask layer. The semiconductor device structure further includes a source/drain (S/D) structure formed adjacent to the gate structure.

20 Claims, 31 Drawing Sheets

(56) References Cited

U.S. PATENT DOCUMENTS

| | | | |
|---|---|---|---|
| 9,923,055 B1* | 3/2018 | Cheng | H01L 23/528 |
| 2006/0216897 A1* | 9/2006 | Lee | H01L 29/0665 |
| | | | 257/E21.415 |
| 2011/0031473 A1* | 2/2011 | Chang | B82Y 10/00 |
| | | | 257/E27.098 |
| 2012/0319178 A1* | 12/2012 | Chang et al. | H01L 29/78696 |
| | | | 257/287 |
| 2013/0302955 A1* | 11/2013 | Vinet | H01L 29/42392 |
| | | | 977/938 |
| 2014/0225065 A1* | 8/2014 | Rachmady | H01L 29/78696 |
| | | | 438/283 |
| 2015/0090958 A1* | 4/2015 | Yang | H01L 29/785 |
| | | | 257/27 |
| 2015/0194489 A1* | 7/2015 | Barraud | H01L 29/78696 |
| | | | 257/9 |
| 2016/0013186 A1* | 1/2016 | Bae et al. | H01L 29/775 |
| | | | 257/401 |
| 2016/0126143 A1 | 5/2016 | Su et al. | |
| 2016/0211322 A1* | 7/2016 | Kim | H01L 29/78696 |
| 2016/0276449 A1* | 9/2016 | Bae et al. | H01L 29/42392 |
| 2017/0133389 A1* | 5/2017 | Yun | H01L 23/528 |
| 2018/0047707 A1* | 2/2018 | Or-Bach et al. | H01L 27/088 |
| 2018/0175036 A1 | 6/2018 | Ching et al. | |
| 2018/0211884 A1 | 7/2018 | Ching et al. | |
| 2018/0277521 A1* | 9/2018 | Or-Bach et al. | H01L 21/743 |
| 2018/0308959 A1* | 10/2018 | Afzalian | H01L 21/823842 |
| 2018/0337037 A1* | 11/2018 | Bouche et al. | H01L 21/28185 |
| 2019/0057867 A1* | 2/2019 | Smith | H01L 21/76224 |
| 2020/0043808 A1* | 2/2020 | Bao et al. | H01L 21/823842 |
| 2020/0058556 A1* | 2/2020 | Ching et al. | H01L 21/823842 |
| 2020/0105581 A1* | 4/2020 | Chang et al. | H01L 29/66545 |
| 2020/0105751 A1* | 4/2020 | Dewey | H01L 29/78696 |
| 2020/0105872 A1* | 4/2020 | Glass et al. | H01L 21/02532 |
| 2020/0411387 A1* | 12/2020 | Chiang et al. | H01L 21/823821 |

* cited by examiner

SEMICONDUCTOR DEVICE STRUCTURE WITH HARD MASK LAYER OVER FIN STRUCTURE AND METHOD FOR FORMING THE SAME

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced increased complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A-1 and 4A-2 are cross-sectional representations of a semiconductor device structure shown in FIG. 3D, in accordance with some embodiments of the disclosure.

FIGS. 6A-1 and 6A-2 are cross-sectional representations of a semiconductor device structure shown in FIG. 5D, in accordance with some embodiments of the disclosure.

DETAILED DESCRIPTION

Figure 1A:
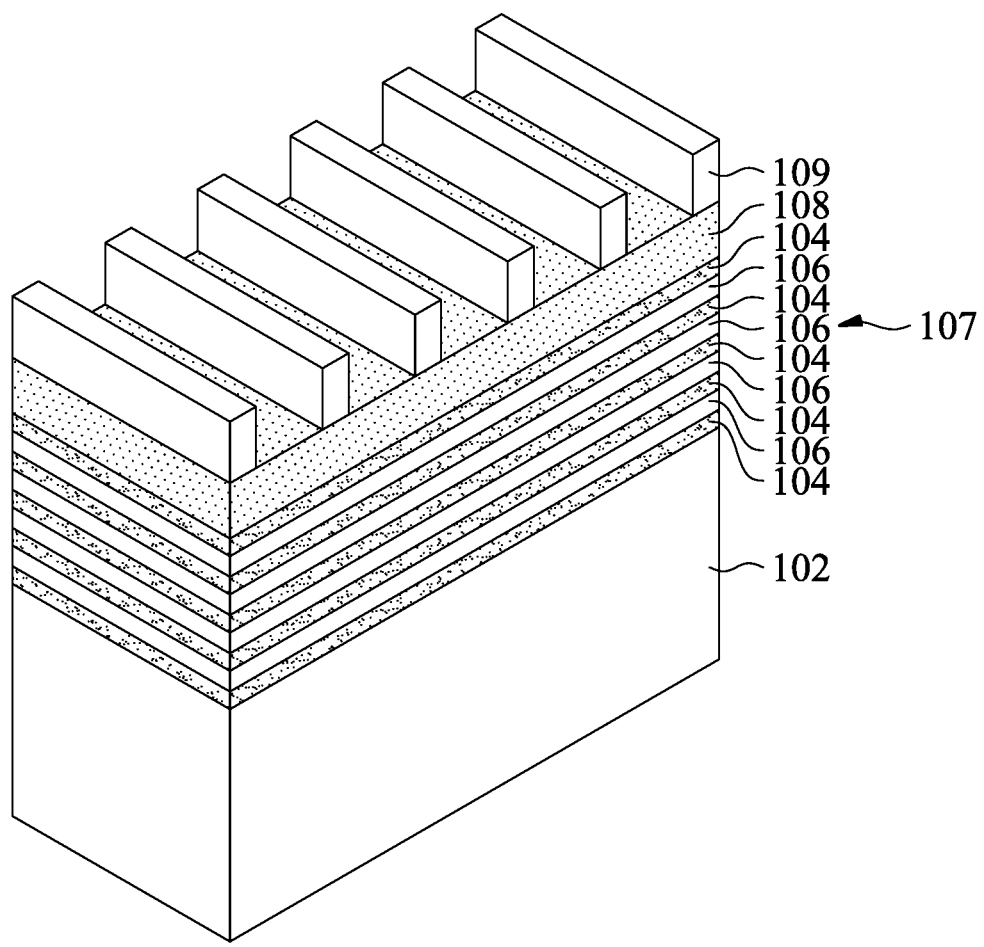
FIGS. 1A to 1O are perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any applicable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor device structure (e.g. GAA structure) and method for forming the same are provided. The semiconductor device structure may include a hard mask layer formed over a fin structure, and a gate structure formed surrounding the hard mask layer and the fin structure, and a portion of the gate structure may be interposed between the fin structure and the hard mask layer, so that the fin structure and the portion of the gate structure may be protected by the hard mask layer during the manufacturing processes.

Figure 1B:
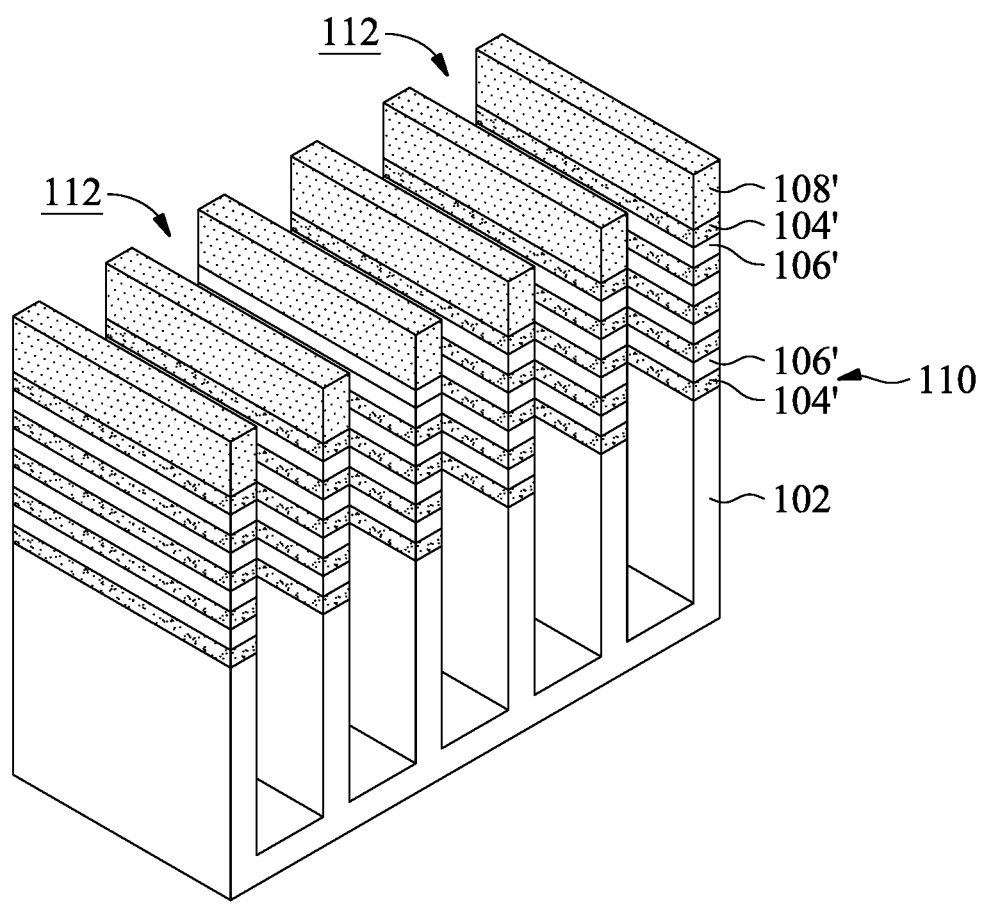
FIGS. 2C-1 and 2C-2 are cross-sectional representations of a semiconductor device structure shown in FIG. 1N, in accordance with some embodiments of the disclosure.
Figure 1C:
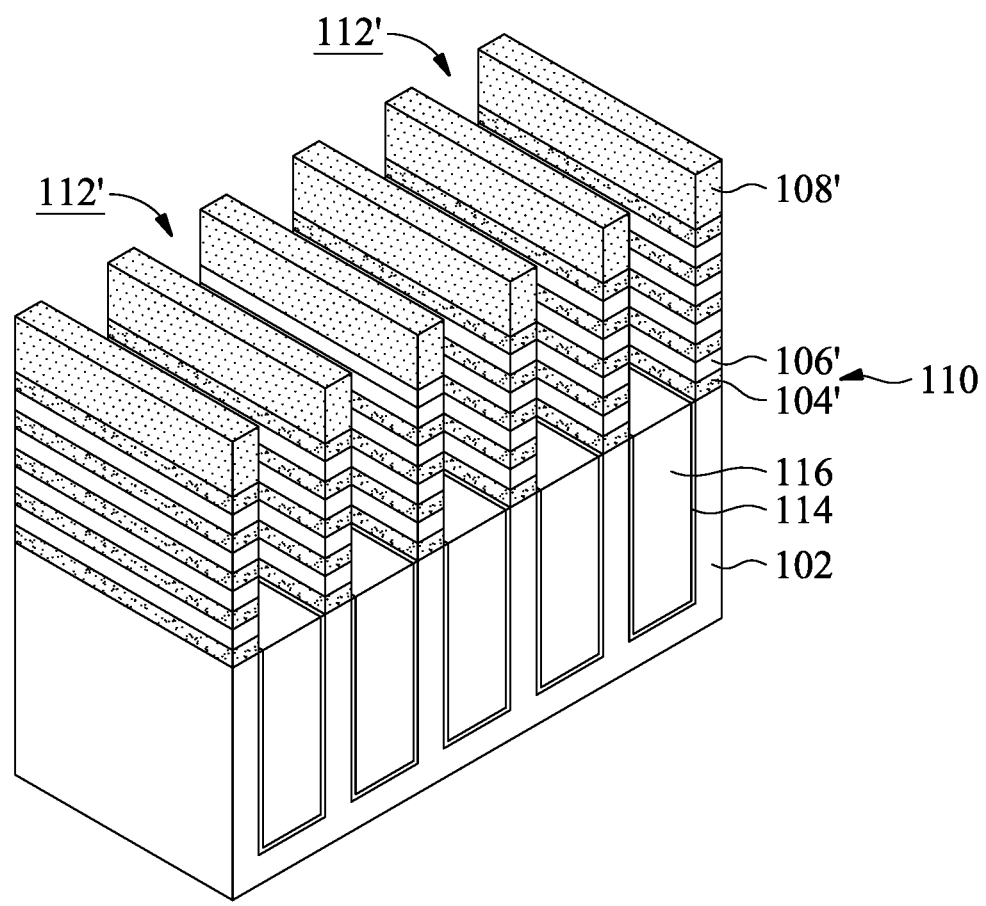
Figure 1D:
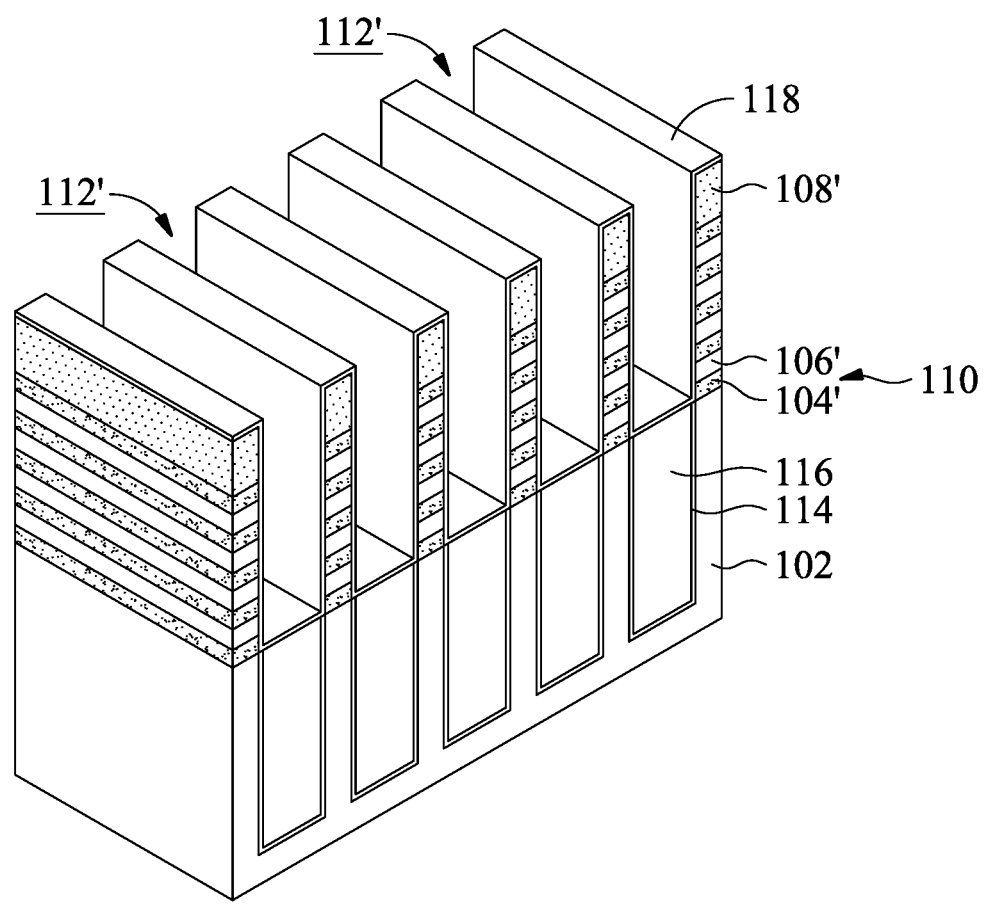
Figure 1E:
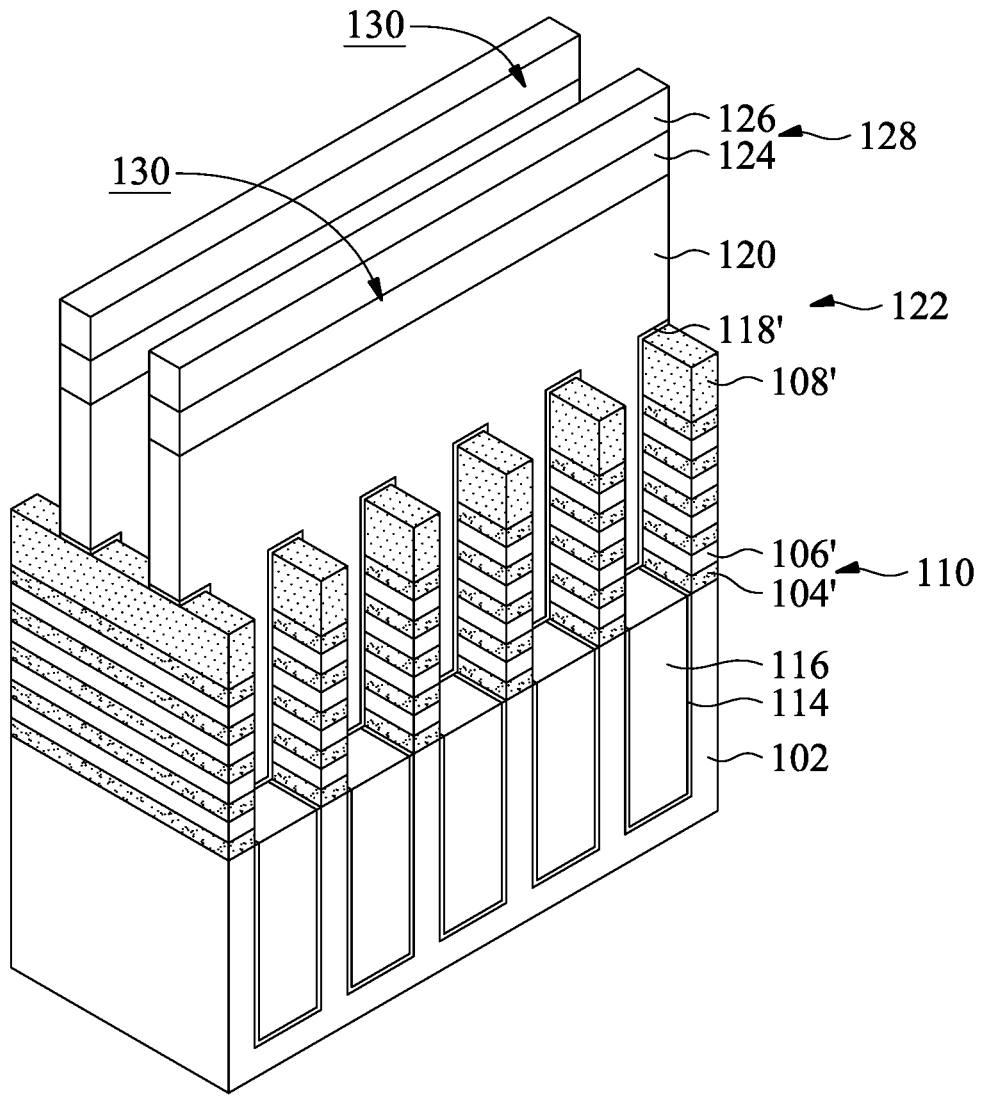
Figure 1F:
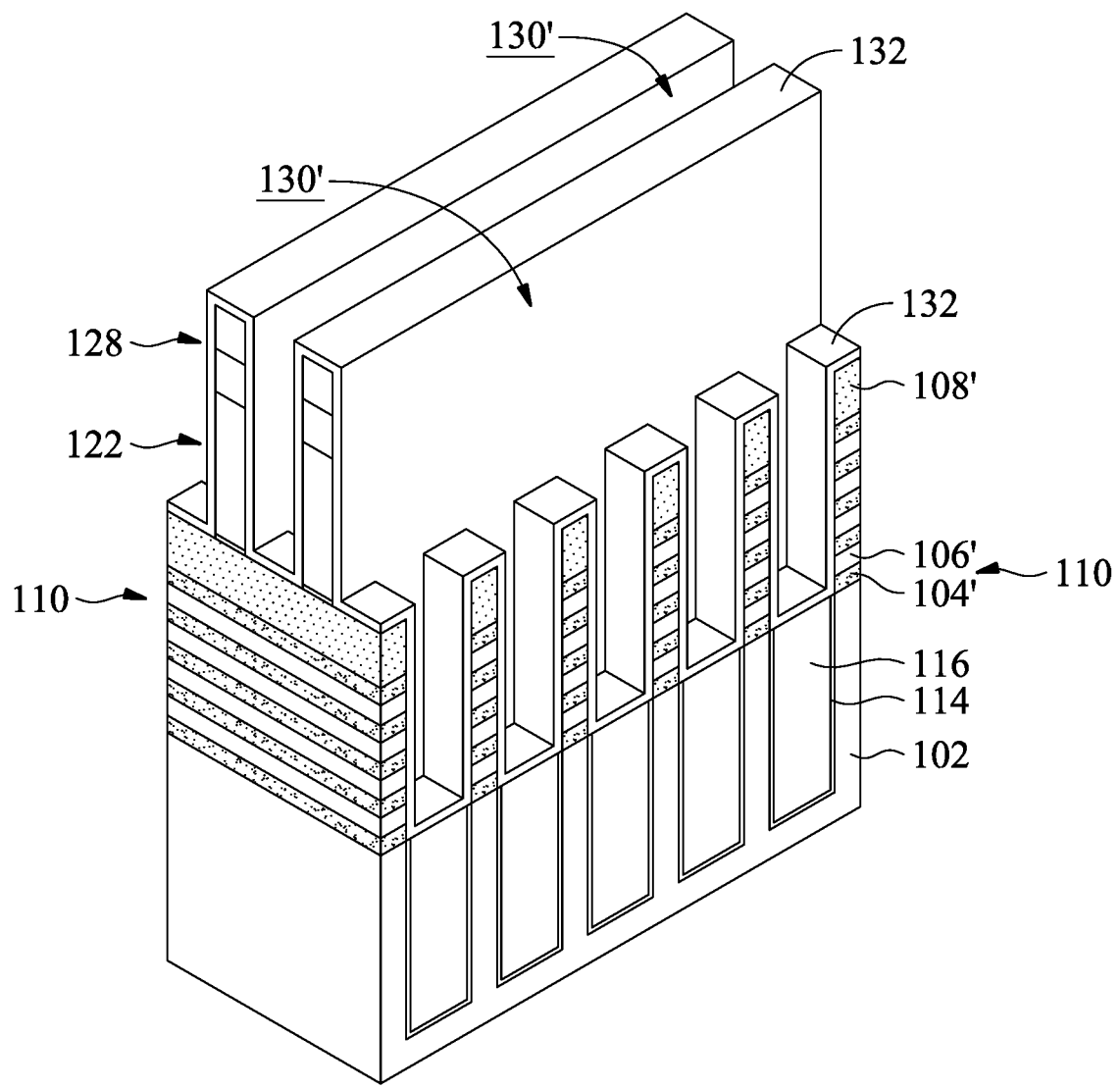
Figure 1G:
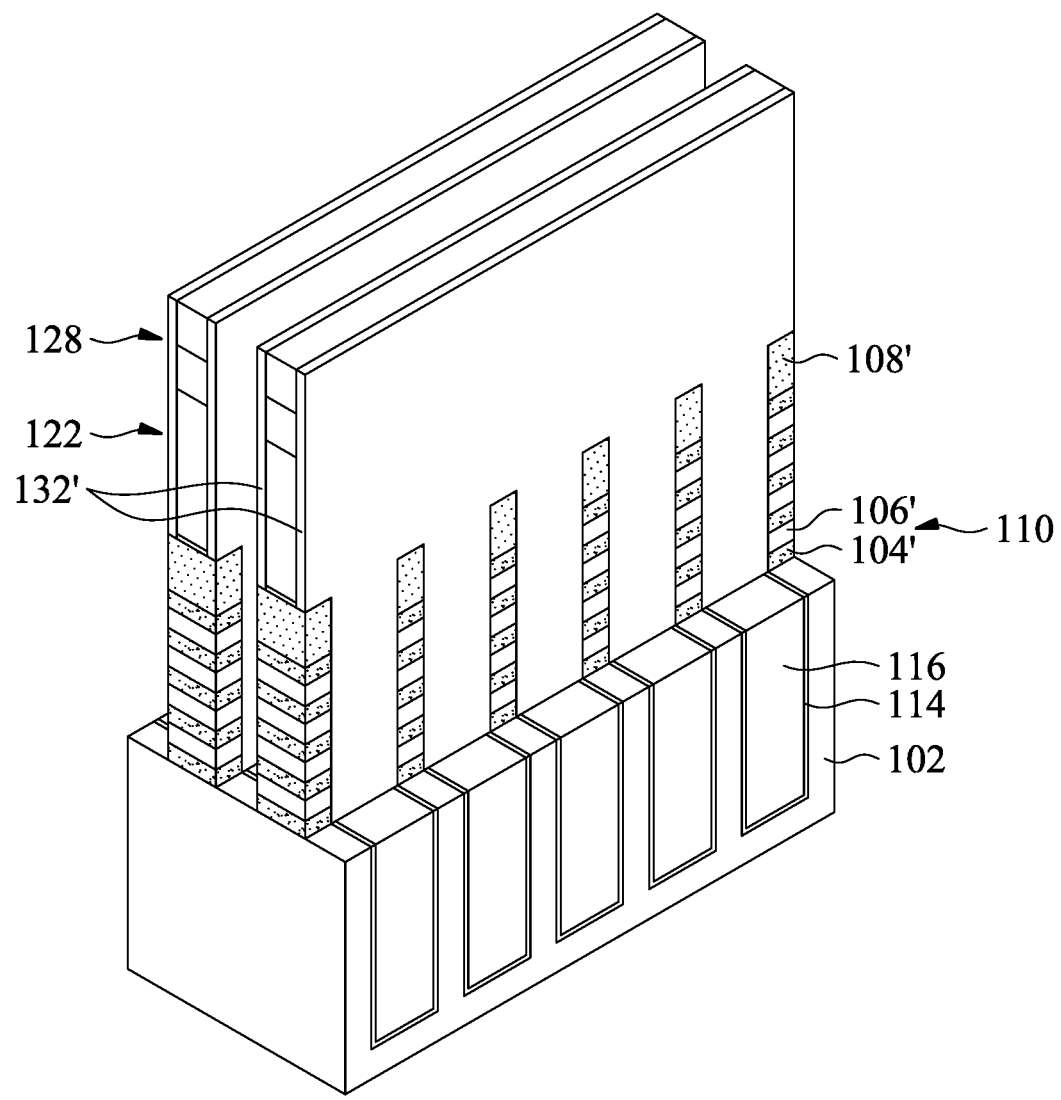
Figure 1H:
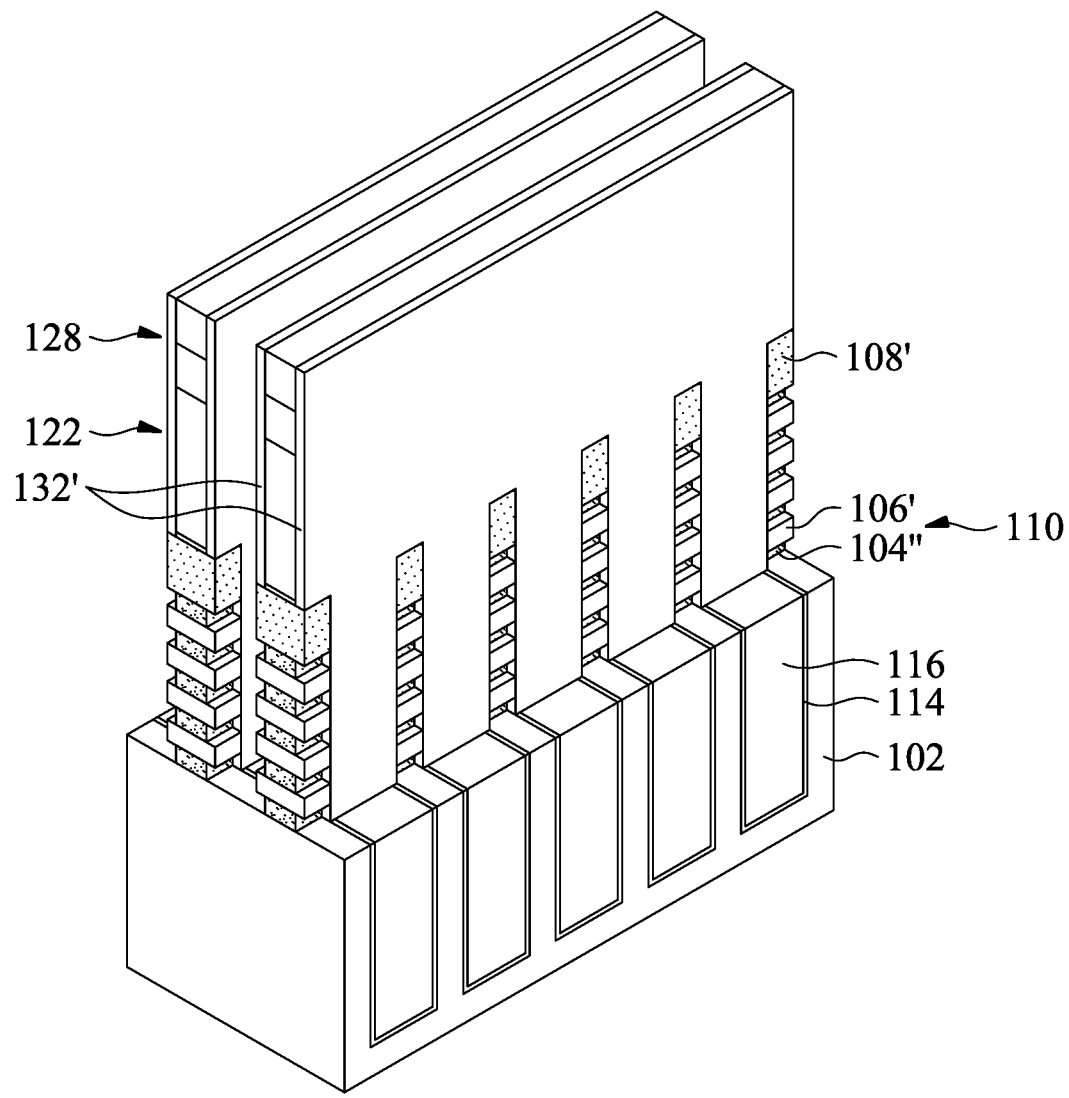
Figure 1I:
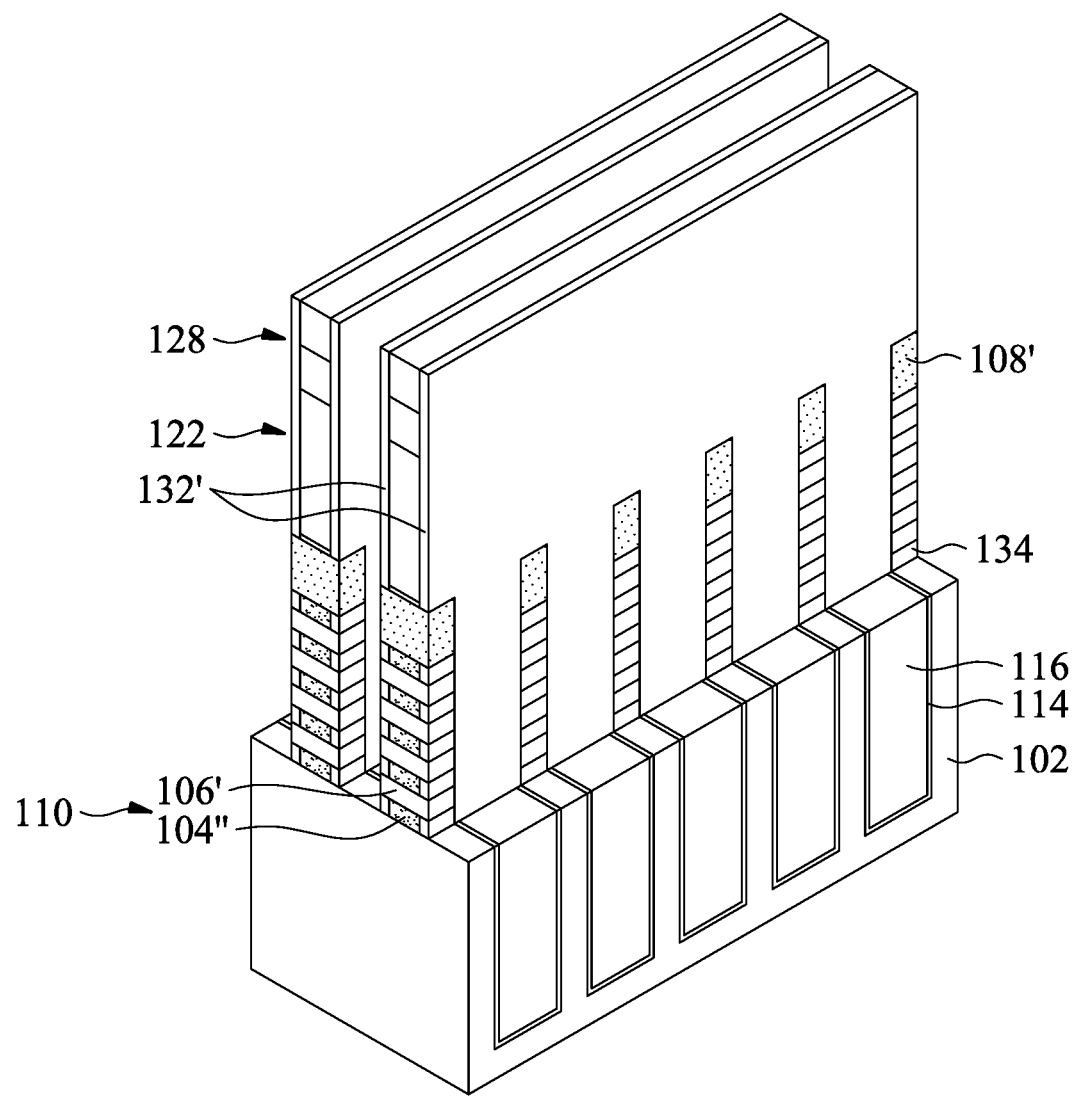
Figure 1J:
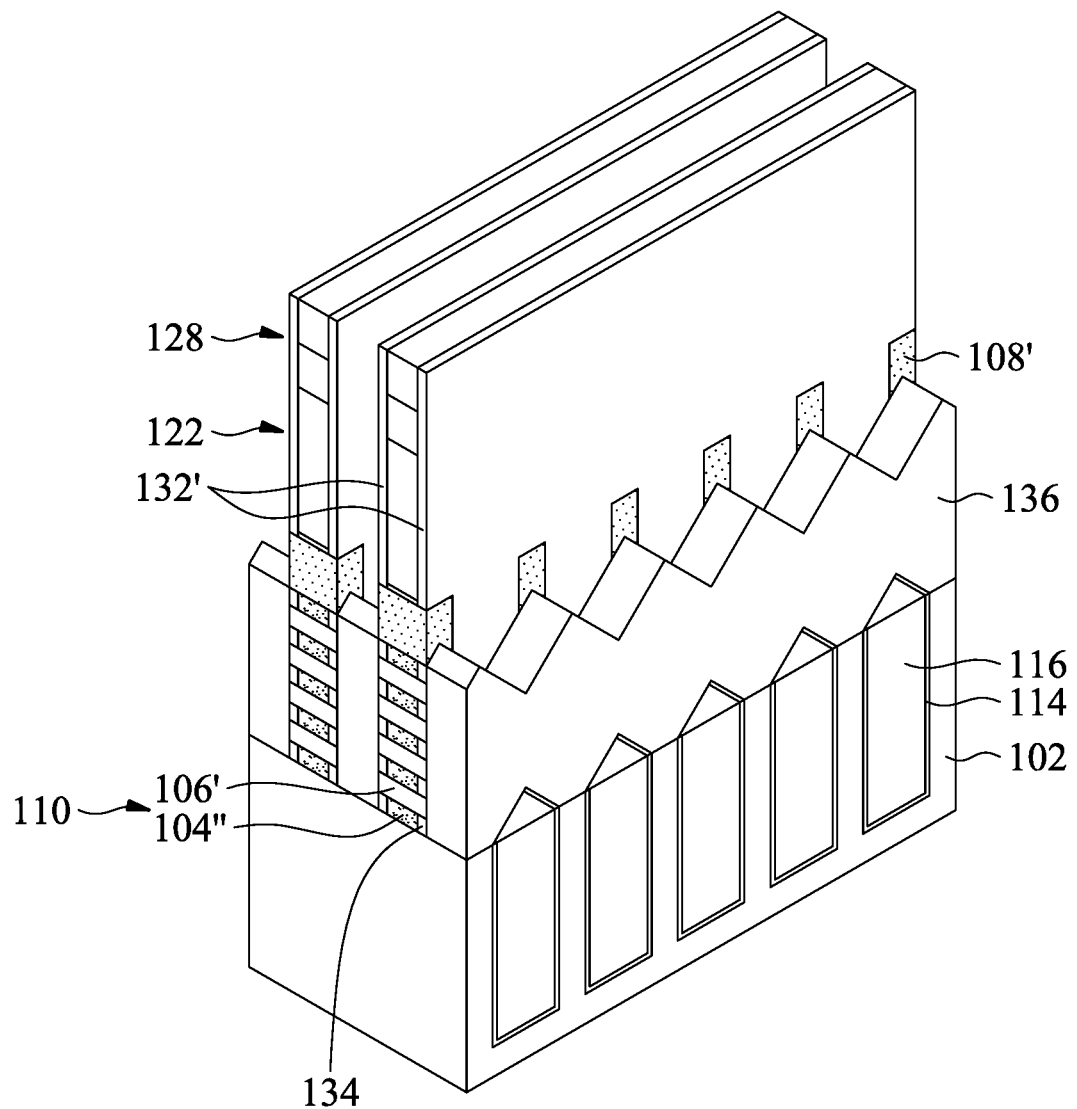
Figure 1K:
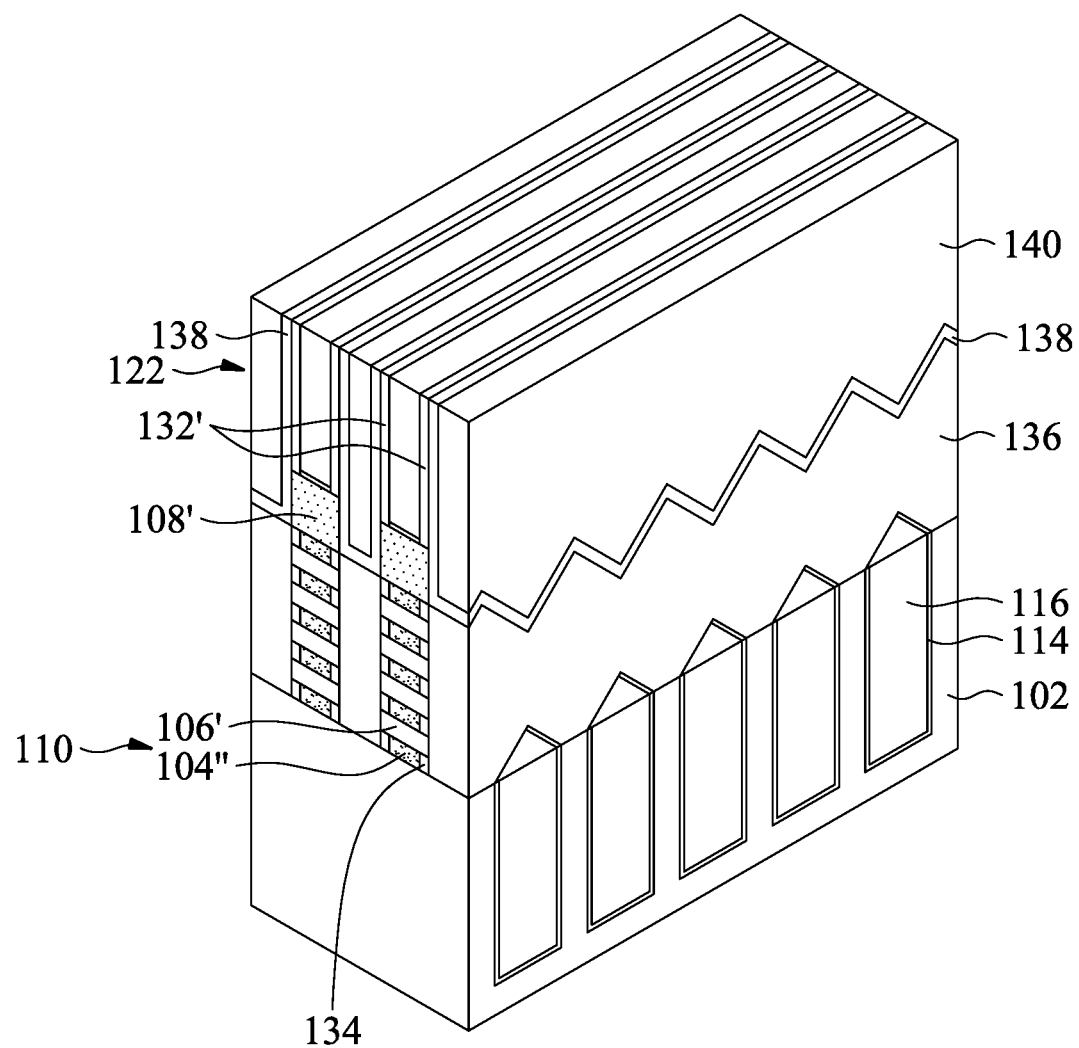
Figure 1L:
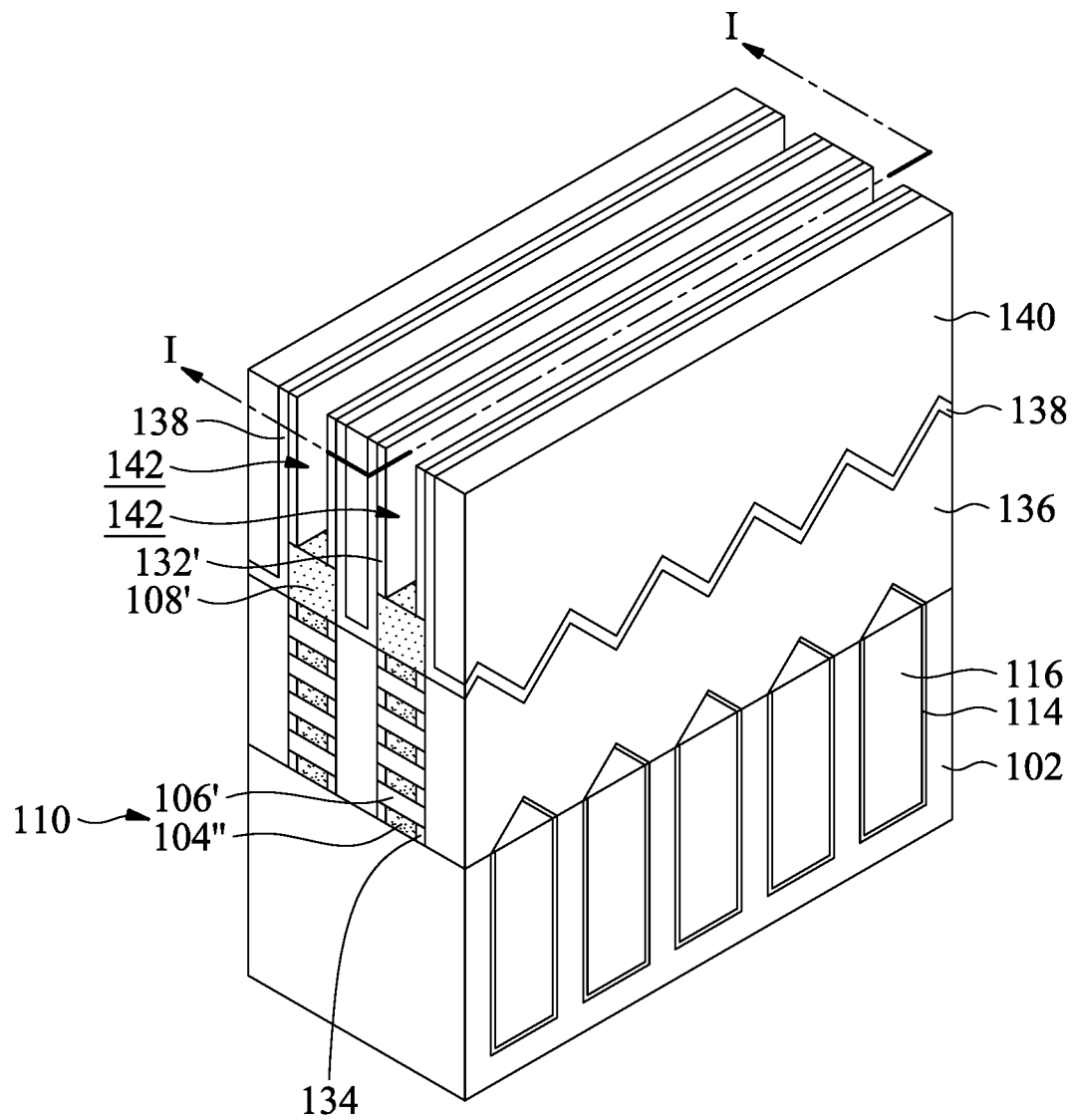
Figure 1M:
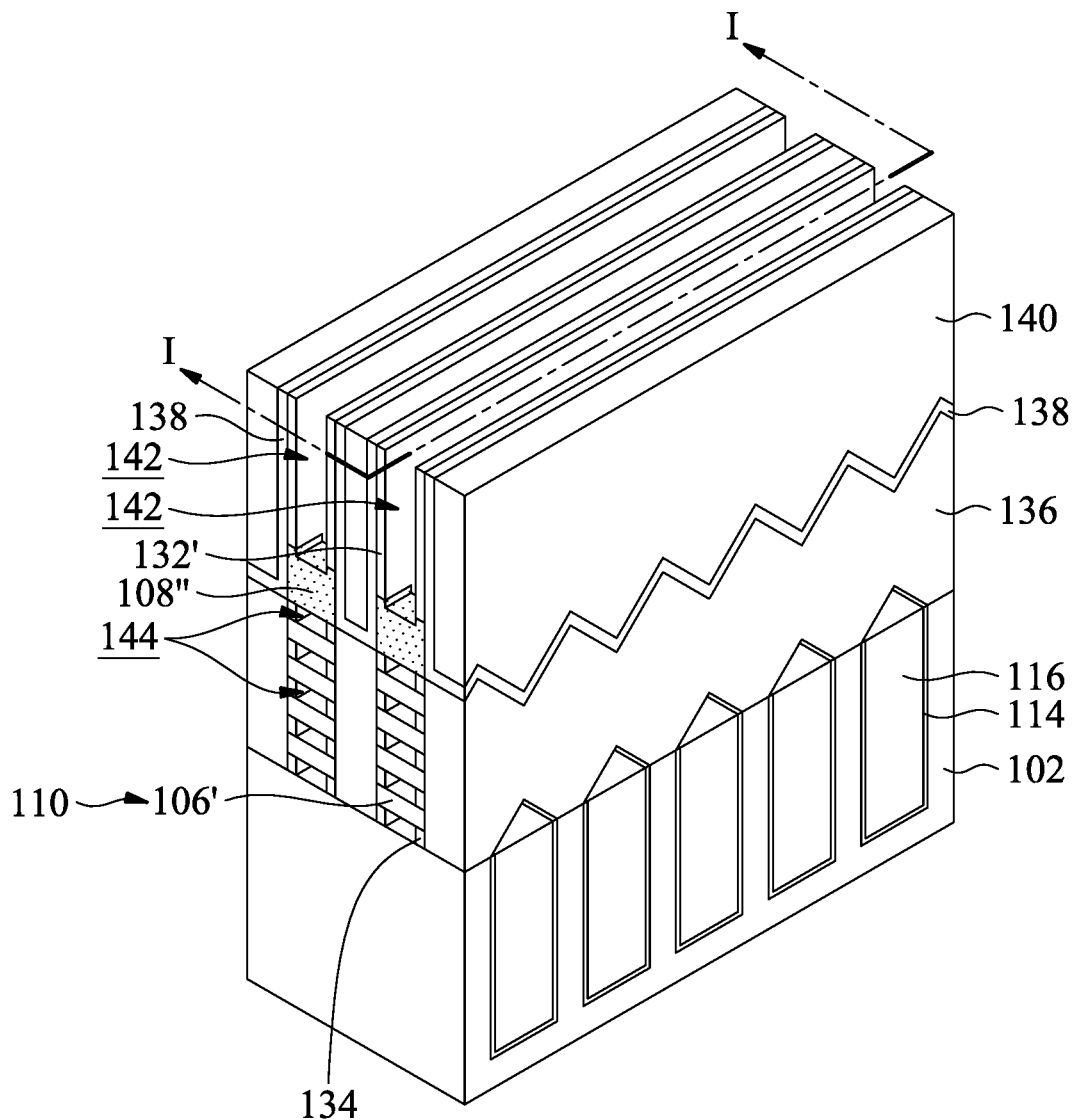
Figure 1N:
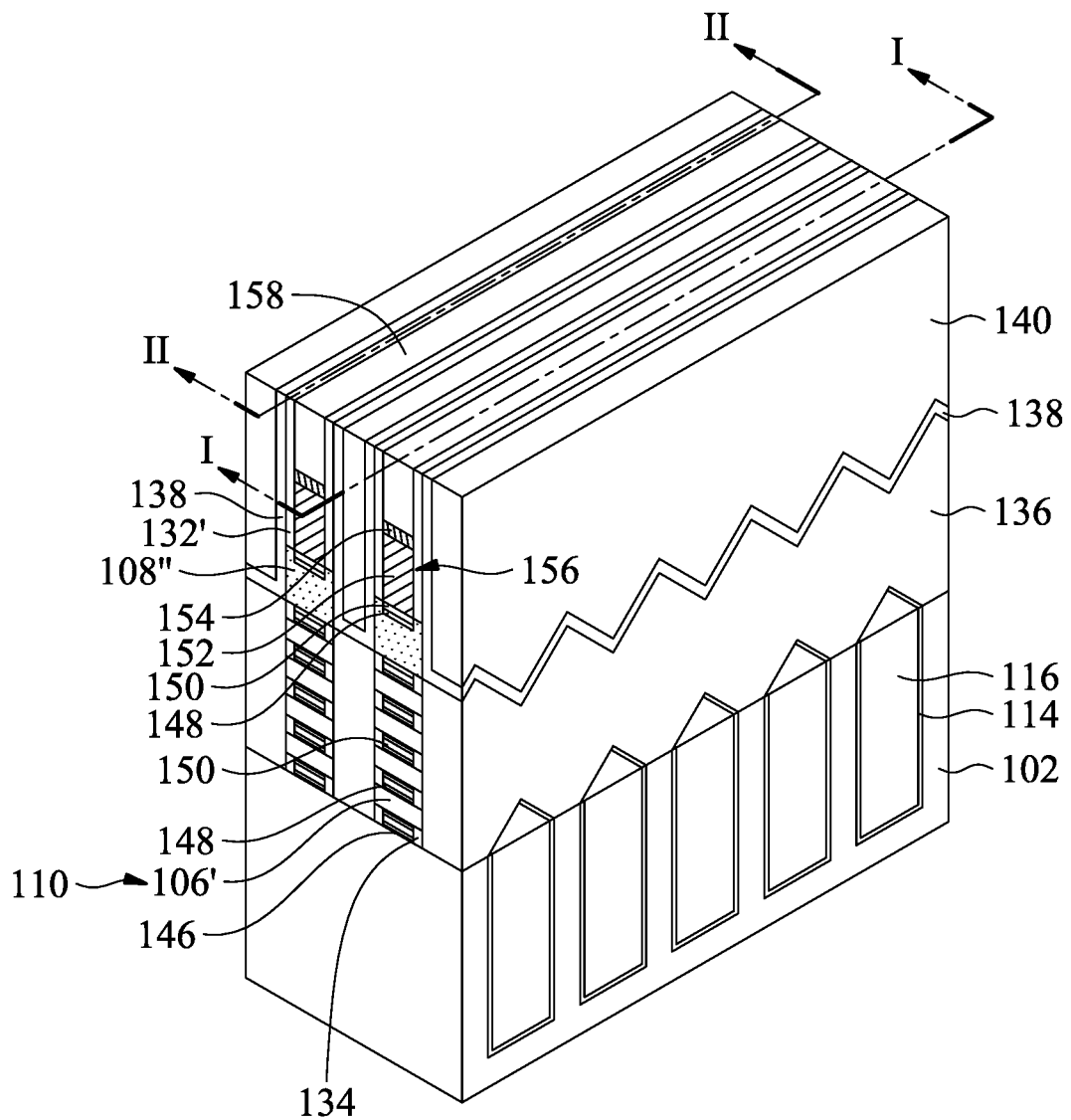
Figure 1O:
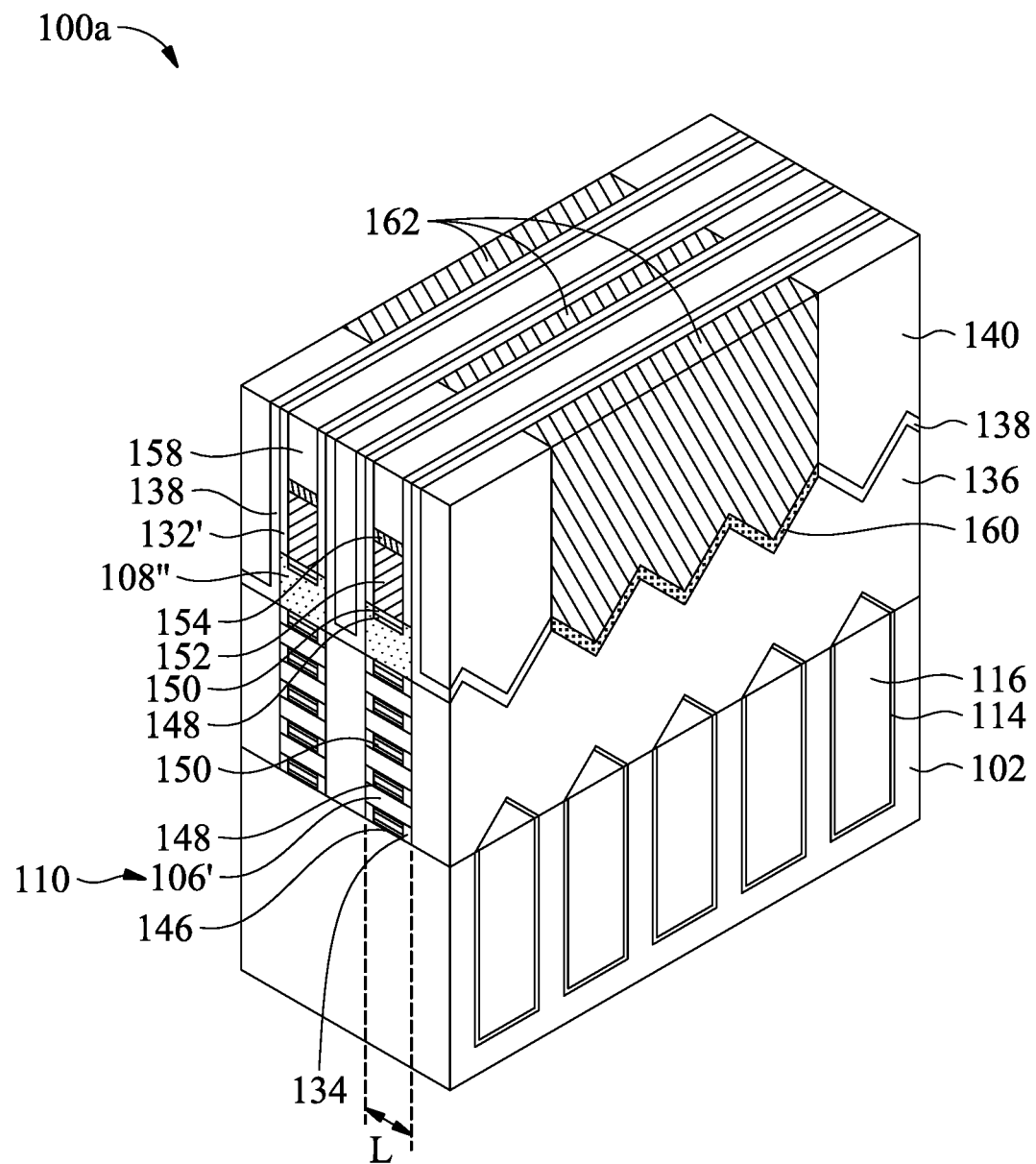
Figure 2A:
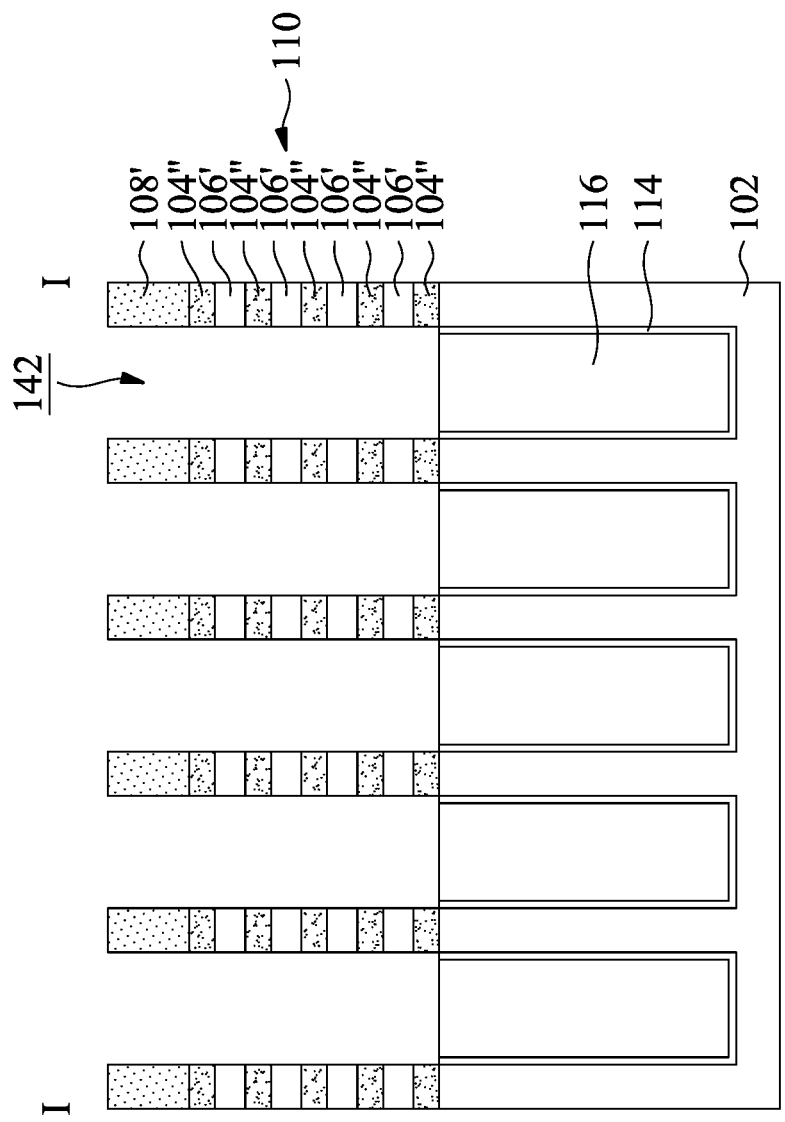
FIGS. 2A and 2B are cross-sectional representations of various stages of forming a semiconductor device structure shown in FIGS. 1L and 1M, in accordance with some embodiments of the disclosure.
Figure 2B:
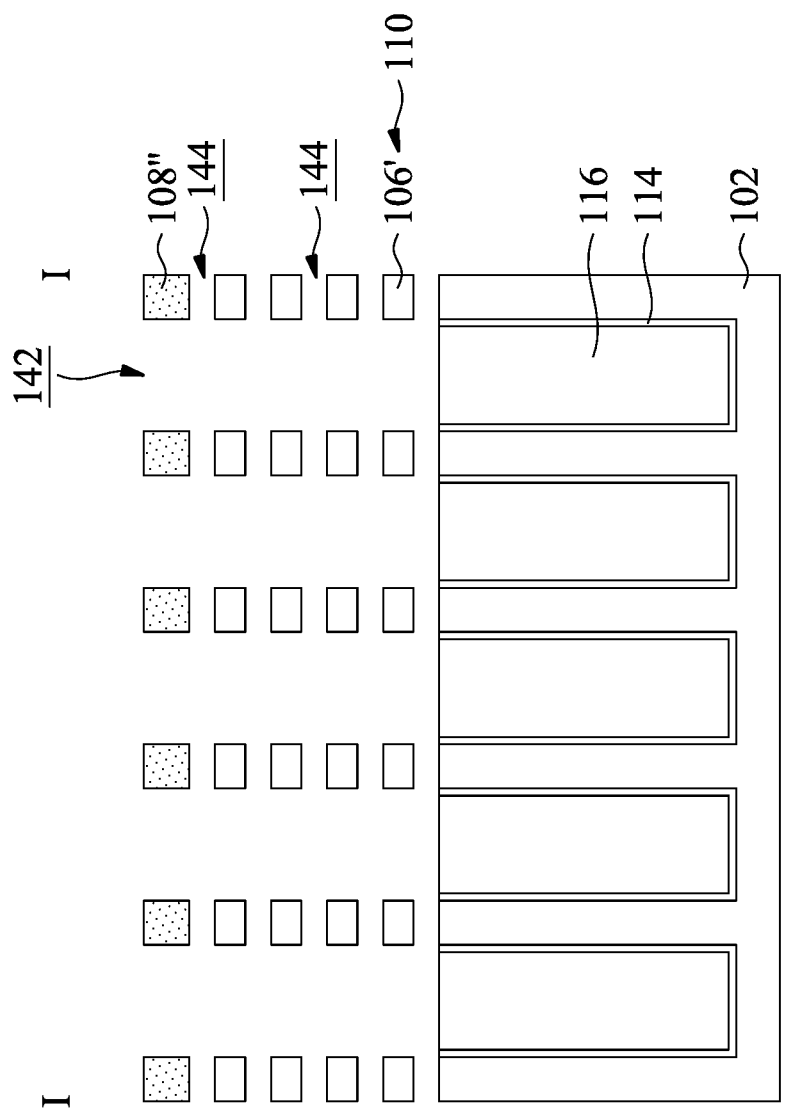

FIGS. 1A to 1O are perspective representations of various stages of forming a semiconductor device structure 100a, in accordance with some embodiments of the disclosure. FIGS. 2A and 2B are cross-sectional representations of various stages of forming the semiconductor device structure 100a shown in FIGS. 1L and 1M, in accordance with some embodiments of the disclosure.

Figures 1, 2C:
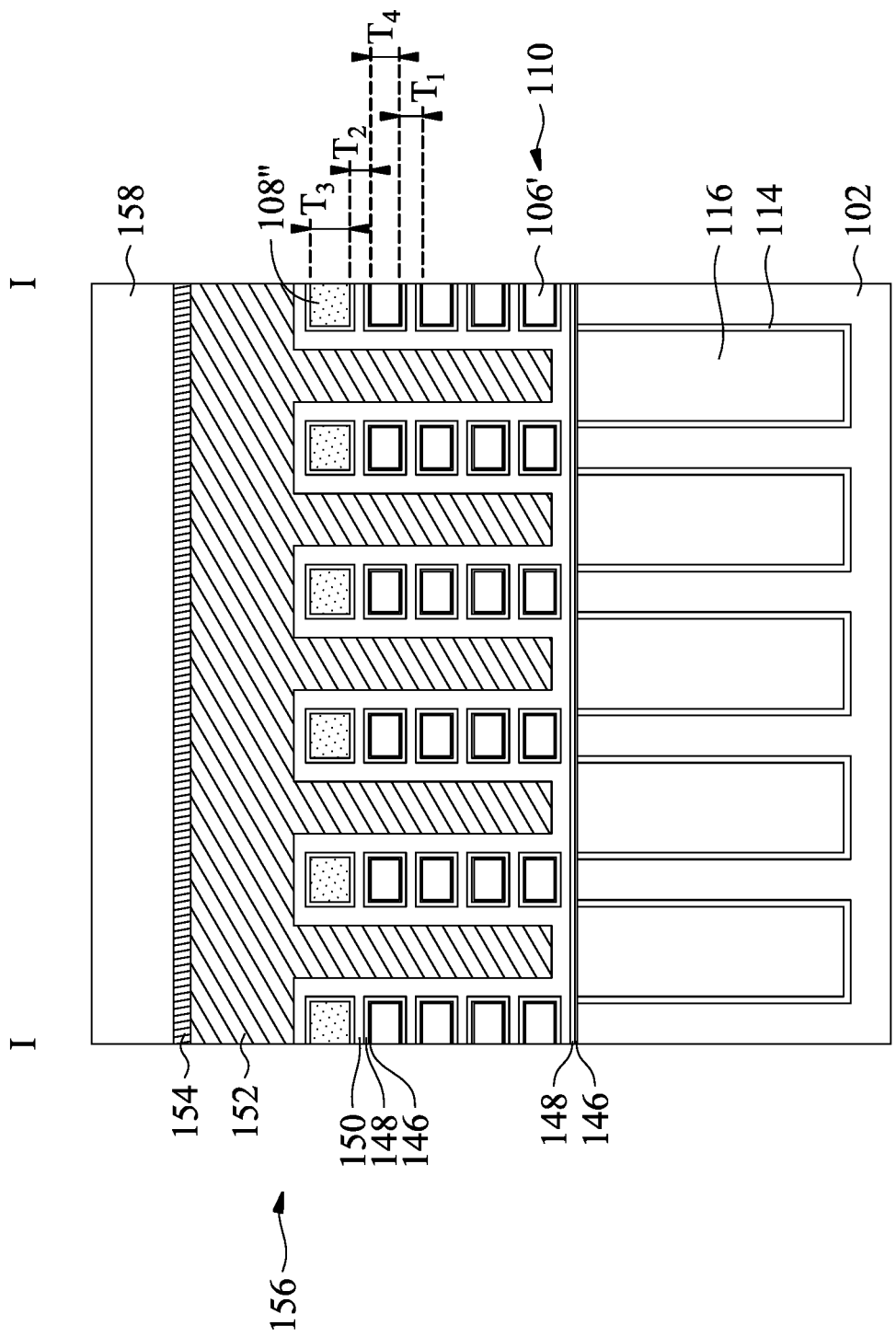
Figures 2, 2C:
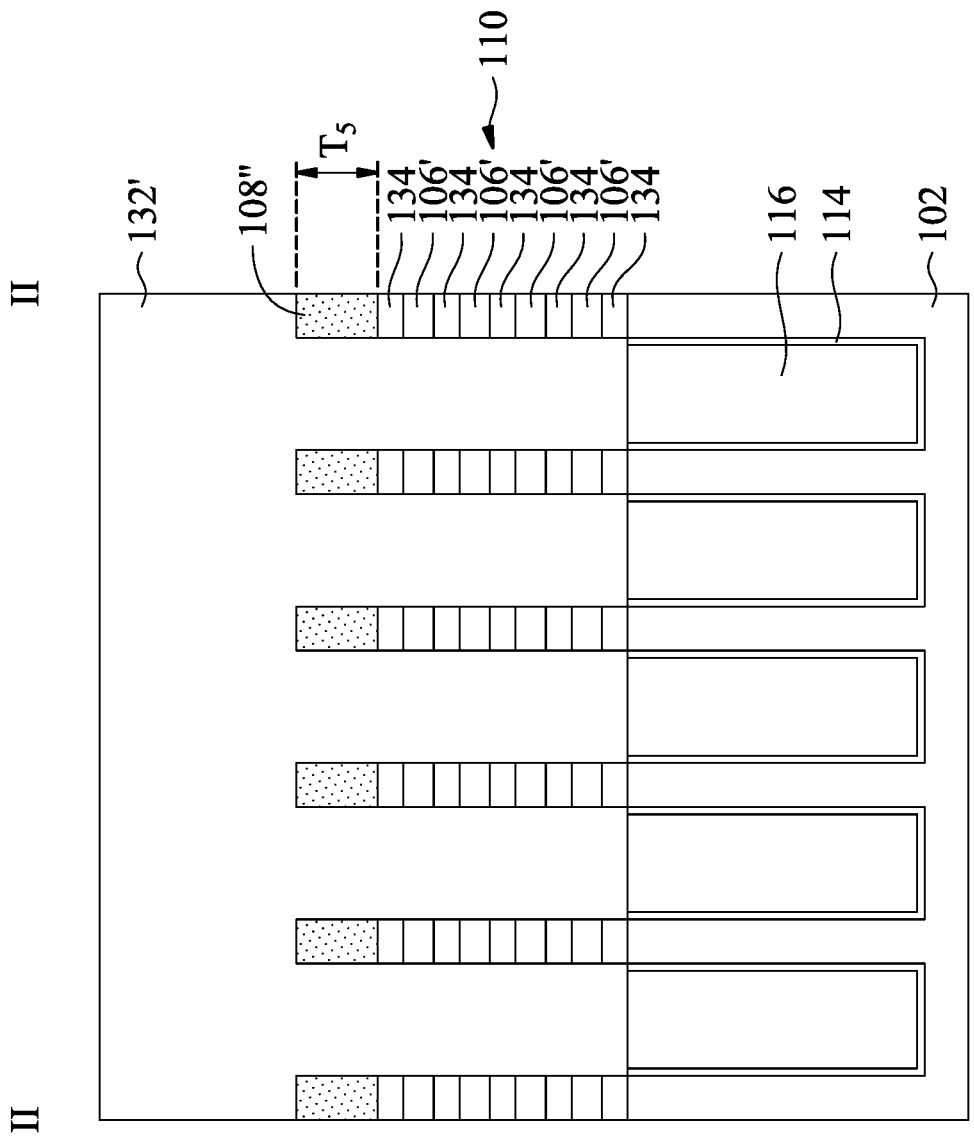

FIGS. 2C-1 and 2C-2 are cross-sectional representations of the semiconductor device structure 100a shown in FIG. 1N, in accordance with some embodiments of the disclosure. FIGS. 2A, 2B and 2C-1 are cross-sectional representations taken along line I-I of FIGS. 1L, 1M and 1N, in accordance with some embodiments. FIG. 2C-2 is a cross-sectional representation taken along line II-II of FIG. 1N, in accordance with some embodiments.

A substrate 102 is received, as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials include, but are not limited to, crystal silicon, polycrystalline silicon, amorphous silicon, germanium, and diamond. Examples of the compound semiconductor materials include, but are not limited to, silicon carbide, gallium arsenic, gallium phosphide, indium phosphide, indium arsenide, and indium antimonide. Examples of the alloy semiconductor materials include, but are not limited to, SiGe, GaAsP, AlInAs, AlGaAs, GaInAs, GaInP, and GaInAsP.

In some embodiments, the substrate 102 includes an epitaxial layer. For example, the substrate 102 has an epitaxial layer overlying a bulk semiconductor. In some embodiments, the substrate 102 is a semiconductor-on-insulator (SOI) substrate which may include a semiconductor substrate, a buried oxide layer over the substrate, and a semiconductor layer over the buried oxide layer.

A stacked structure 107 is formed over the substrate 102, as shown in FIG. 1A in accordance with some embodiments. In some embodiments, the stacked structure 107 includes first semiconductor materials 104 of a first composition interposed by second semiconductor materials 106 of a second composition, such that the first semiconductor materials 104 and the second semiconductor materials 106 have different etching rates in subsequent etching process. In some embodiments, the first semiconductor materials 104 and the second semiconductor materials 106 are stacked in an alternating manner.

In some embodiments, the first semiconductor materials 104 and the second semiconductor materials 106 include Si, Ge, SiGe, GaAs, InSb, GaP, GaSb, InAlAs, InGaAs, GaSbP, GaAsSb, or InP. In some embodiments, the first semiconductor materials 104 are SiGe and the second semiconductor materials 106 are Si.

In some embodiments, the first semiconductor materials 104 and the second semiconductor materials 106 are formed by using low pressure chemical vapor deposition (LPCVD) process, epitaxial growth process, another applicable method, or a combination thereof. In some embodiments, the epitaxial growth process includes molecular beam epitaxy (MBE), metal organic chemical vapor deposition (MOCVD), or vapor phase epitaxy (VPE).

The first semiconductor materials 104 or portions thereof may serve to define gap distance between adjacent channel regions for the semiconductor device structure 100a formed subsequently, and the second semiconductor materials 106 or portions thereof may serve as channel regions for the semiconductor device structure 100a formed subsequently. For example, the second semiconductor materials 106 may be referred to as "nanowires" used to form channel regions of the semiconductor device structure 100a such as a GAA device.

It should be noted that although five layers of the first semiconductor materials 104 and four layers of the second semiconductor materials 106 are illustrated in FIG. 1A, the number of second semiconductor materials 106 may be in a range from 2 to 10, and the total number of first semiconductor materials 104 is one layer more than the total number of second semiconductor materials 106.

Moreover, a hard mask material 108 is formed over the stacked structure 107, and a patterned photoresist layer 109 is formed over the hard mask material 108, as shown in FIG. 1A in accordance with some embodiments. In some embodiments, the hard mask material 108 includes one or more dielectric material, such as silicon carbide, silicon oxide, silicon nitride, silicon oxynitride, other applicable dielectric materials, or a combination thereof.

The material of the hard mask material 108 may be chosen based on device performance and manufacturing considerations. In some embodiments, the hard mask material 108 includes a dielectric material with a dielectric constant (k value) less than 7, such as SiCN, SiOC, SiOCN, or a combination thereof. In some embodiments, the hard mask material 108 includes a high-k dielectric material (e.g. k>7), such as $HfO_2$, $ZrO_2$, $HfAlO_x$, $Al_2O_3$, or a combination thereof.

In some embodiments, the hard mask material 108 is a multi-layered structure. For example, the hard mask material 108 may include a lower layer which is made of silicon oxide and an upper layer which is made of silicon nitride. In some embodiments, the hard mask material 108 may be formed in a deposition process, which may include a chemical vapor deposition (CVD) process, a high-density plasma chemical vapor deposition (HDPCVD) process, a spin-on process, a sputtering process, or another applicable process.

In addition, the patterned photoresist layer 109, which is formed over the hard mask material 108, may be formed by a deposition process and a subsequent patterning process. The deposition process for forming the patterned photoresist layer 109 may include a CVD process, a HDPCVD process, a spin-on process, a sputtering process, or another applicable process. The patterning process for forming the patterned photoresist layer 109 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the patterned photoresist layer 109 is formed, the hard mask material 108 is patterned to form a hard mask layer 108' by using the patterned photoresist layer 109 as a mask, as shown in FIG. 1B in accordance with some embodiments. After the hard mask layer 108' is formed, the patterned photoresist layer 109 is removed in accordance with some embodiments. In some embodiments, the hard mask layer 108' is a non-functional dummy channel layer. In some embodiments, the hard mask layer 108' is a protection layer, which protects the underlying structures from being damaged during the subsequent processes.

Next, an etching process is performed on the stacked structure 107 and the substrate 102 to form fin structures 110 by using the hard mask layer 108' as a mask in accordance with some embodiments. Specifically, the etching process removes portions of the stacked structure 107 which are exposed by the hard mask layer 108' and further recesses the substrate 102 to form first semiconductor layers 104', second semiconductor layers 106' and trenches 112 between the fin structures 110, in accordance with some embodiments.

After the etching process, the substrate 102 has protruded portions between the trenches 112 which form lower portions of the fin structures 110, and the first semiconductor layers 104' and the second semiconductor layers 106' form upper portions of the fin structures 110 in accordance with some embodiments. In some embodiments, the etching process includes a dry etching process, such as reactive-ion etching (RIE) or neutral-beam etching (NBE), a wet etching process, or a combination thereof.

After the fin structures 110 are formed, a lining layer 114 and isolation structures 116 are formed in the trenches 112, as shown in FIG. 1C in accordance with some embodiments. In some embodiments, the methods for forming the lining layer 114 and the isolation structures 116 include forming a lining material conformally covering the substrate 102, the fin structures 110, and the hard mask layer 108', and forming an insulating material over the lining material and filling the trenches 112. Afterwards, the insulating material and the lining material are partially removed to form the reduced trenches 112' over the remaining portions of the lining material and the insulating material (i.e., the lining layer 114 and the isolation structures 116).

In some embodiment, the lining layer 114 and the isolation structures 116 are made of silicon oxide, silicon nitride, silicon oxynitride, other applicable insulating materials, or a combination thereof. In some embodiments, the lining layer 114 and the isolation structures 116 are formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

It should be noted that, even after the lining layer 114 and the isolation structures 116 are formed, the hard mask layer 108' is not removed, and a dummy gate dielectric material 118 is formed to conformally cover top surfaces and sidewalls of the hard mask layer 108', as shown in FIG. 1D in accordance with some embodiments. In some embodiments, sidewalls of the upper portions of the fin structures 110, top surfaces of the isolation structures 116 and top surfaces of the lining layer 114 are conformally covered by the dummy gate dielectric material 118.

In some embodiments, the dummy gate dielectric material 118 includes one or more dielectric materials, such as silicon oxide, silicon nitride, silicon oxynitride, or a combination thereof. In some embodiments, the dummy gate dielectric layer 118 is a dielectric material with a high dielectric constant (k value), for example, greater than 3.9. In some embodiments, the high-k dielectric material includes $HfO_2$, HfZrO, HfSiO, HfTiO, HfAlO, another applicable high-k dielectric material, or a combination thereof. In some embodiments, the dielectric material is formed by using thermal oxidation, CVD, ALD, physical vapor deposition (PVD), another applicable method, or a combination thereof.

Afterwards, dummy gate structures 122 are formed across the fin structures 110 and the hard mask layer 108', as shown in FIG. 1E in accordance with some embodiments. In some embodiments, a hard mask layer 128 over the dummy gate structures 122 is formed. The hard mask layer 128 may be used as an etching mask for forming the dummy gate structure 122.

In some embodiments, each of the dummy gate structures 122 includes a dummy gate dielectric layer 118' and a dummy gate electrode layer 120, and the hard mask layer 128 includes an oxide layer 124 (e.g. silicon oxide) and a nitride layer 126 (e.g. silicon nitride) formed over the oxide layer 124. In addition, trenches 130 are formed between the dummy gate structures 122 in accordance with some embodiments.

In some embodiments, the methods for forming the dummy gate structures 122 includes forming a dummy gate electrode material over the dummy gate dielectric material 118 and filling the reduced openings 112' with the dummy gate electrode material, and forming a hard mask layer 128 over the dummy gate electrode material. The hard mask layer 128 may be formed by a deposition process and a patterning process. Next, the portions of the dummy gate electrode material and the portions of the dummy gate dielectric material 118 exposed by the hard mask layer 128 are removed to expose the hard mask layer 108' in accordance with some embodiments.

During the partial removal process (e.g. etching process) of the dummy gate electrode material and the dummy gate dielectric material 118 for forming the dummy gate structures 122, the profiles of the dummy gate structures 122 may not be easily controlled. For example, the dummy gate structures 122 may have widths that gradually increase from top portions to bottom portions (i.e. the bamboo issue) after the partial removal process, such that a leakage path may occur at the bottom portions of the gate structures which replace the dummy gate structures 122 in the subsequent processes. However, if the dummy gate electrode material and the dummy gate dielectric material 118 are heavily etched to form the dummy gate structures 122 with widths substantially the same from top portions to bottom portions, the risk of damaging the fin structures 110 may be increased.

Accordingly, in some embodiments, since the hard mask layer 108' is formed over the fin structures 110, the fin structures 110 can be protected by the hard mask layer 108' during the heavy partial removal process for forming the dummy gate structures 122. Therefore, the problems of bamboo issue and damage to the fin structures 110 can be prevented at the same time, even when the fin pitch and gate length are relatively small due to scaling-down of the structure.

It should be noted that the top surfaces and sidewalls of the hard mask layer 108' are partially exposed by the trenches 130 between the dummy gate structures 122, in accordance with some embodiments. Moreover, in some embodiments, the sidewalls of the first semiconductor layers 104' and the sidewalls of the second semiconductor layers 106' are partially exposed.

In some embodiments, the dummy gate electrode layers 120 are made of a conductive material. In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 120 are formed by a deposition process, such as CVD, PVD, or a combination thereof, and a subsequent etching process.

After the dummy gate structures 122 are formed, a gate spacer layer 132 is formed over the top surfaces and the sidewalls of the dummy gate structures 122 as shown in FIG. 1F in accordance with some embodiments. In some embodiments, the top surfaces and the sidewalls of the hard mask layer 108', the sidewalls of the fin structures 110, and the top surfaces of the isolation structures 116 are conformally covered by the gate spacer layer 132, such that reduced trenches 130' between the dummy gate structures 122 are obtained, and the gate spacer layer 132 is formed lining sidewalls of the trenches 130.

In some embodiments, the gate spacer layer 132 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the gate spacer layer 132 is formed by using CVD (such as LPCVD, PECVD, or sub-atmospheric CVD (SACVD)), ALD, another applicable method, or a combination thereof.

Next, pairs of gate spacers 132' over opposite sidewalls of the dummy gate structures 122 are formed from the gate spacer layer 132, and portions of fin structures 110 exposed by the dummy gate structures 122 and the gate spacers 132' are removed, as shown in FIG. 1G in accordance with some embodiments. In some embodiments, the gate spacer layers 132' are formed by removing the portions of the gate spaces layer 132 over the hard mask layer 128 and removing the portions of the gate spacer layer 132 over the top surfaces of the hard mask layer 108'. In some embodiments, the portions of the gate spacer layer 132 over the top surfaces of the isolation structures 116 are removed. The partial removal processes for the gate spacer layer may include a dry etching process, a wet etching process, or a combination thereof.

After the gate spacers 132' are formed, the portions of fin structures 110 exposed by the dummy gate structures 122 and the gate spacers 132' are removed, in accordance with some embodiments. The partial removal process for the fin structures 110 may include a dry etching process, a wet etching process, or a combination thereof.

In some embodiments, the top surface of the substrate 102 is level with the top surfaces of isolation structures 116 and the bottom surfaces of the first semiconductor layers 104' after the partial removal process for the fin structures 110. In some embodiments, after the partial removal process for the fin structures 110 is performed, the top surface of the substrate 102 is lower than the top surfaces of isolation structures 116 and the bottom surfaces of the first semiconductor layers 104' depending on the parameters of the partial removal process.

Afterwards, the first semiconductor layers 104' covered by the hard mask layer 108' are laterally etched so that etched first semiconductor layers 104" are obtained, as shown in FIG. 1H in accordance with some embodiments. In some embodiments, outer portions of the first semiconductor layers 104' are removed, and inner portions of the first semiconductor layers 104' directly covered by the dummy gate structures 122 remain as the etched first semiconductor layers 104".

In some embodiments, the lateral etching of the first semiconductor layers 104' includes a dry etching process, a wet etching process, or a combination thereof. In some embodiments, the sidewalls of the etched first semiconductor layers 104" are not aligned with the sidewalls of the second semiconductor layers 106'.

After the first semiconductor layers 104' are laterally etched, inner spacers 134 are formed over sidewalls of the etched first semiconductor layers 104", as shown in FIG. 1I in accordance with some embodiments. The inner spacers 134 are made of a dielectric material with k-value lower than 6, such as in a range from about 2 to about 6, in accordance with some embodiments. In some embodiments, the inner spacers 134 are used to reduce the parasitic capacitance between the gate structure and the source/drain (S/D) structure formed subsequently. If the k-value of the inner spacers 134 is too high, the inner spacers 134 may not help reduce the parasitic capacitance.

In some embodiments, the inner spacers 134 are made of silicon oxycarbide (SiOC), silicon oxide carbonitride (SiOCN), silicon carbon nitride (SiCN), or a combination thereof. In some embodiments, the inner spacers 134 are formed by a deposition process and a subsequent etch-back process. The deposition process may include a CVD process (such as LPCVD, PECVD, SACVD, or FCVD), an ALD process, another applicable method, or a combination thereof. The etch-back process may include a dry etching process or a wet etching process.

In some embodiments, the interfaces between the etched first semiconductor layers 104" and the inner spacers 134 are directly below the dummy gate structures 122. In some embodiments, interfaces between the etched first semiconductor layers 104" and the inner spacers 134 are aligned with the interfaces between the dummy gate structures 122 and the gate spacers 132'.

After the inner spacers 134 are formed, source/drain (S/D) structures 136 are formed at opposite sidewalls of the dummy gate structures 122, as shown in FIG. 1J, in accordance with some embodiments. In some embodiments, the S/D structures 136 are separated from the dummy gate structures 122 by the gate spacers 132', and the S/D structures 136 are separated from the etched first semiconductor layers 104" by the inner spacers 134. In addition, the S/D structures 136 are in direct contact with the second semiconductor layers 106', in accordance with some embodiments.

In some embodiments, the S/D structures 136 are made of Ge, Si, SiGe, InAs, InGaAs, InSb, GaAs, GaSb, InAlP, InP, AlGaAs, GaAsP, SiP, SiC, SiCP, another applicable material, or a combination thereof. In some embodiments, the S/D structures 136 are formed by using one or more epitaxial growth processes, such as MBE, MOCVD, VPE, another applicable epitaxial growth process, or a combination thereof.

In some embodiments, the S/D structures 136 are in-situ doped during the epitaxial growth process. For example, the S/D structures 136 may be the epitaxially grown SiGe doped with boron (B). In some embodiments, the S/D structures 136 are doped in one or more implantation processes after the epitaxial growth process.

In some embodiments, the S/D structures 136 are activated by an annealing process. In some embodiments, the annealing processes include a rapid thermal annealing (RTA), a laser annealing process, another applicable annealing process, or a combination thereof.

Afterwards, a contact etching stop layer (CESL) 138 is formed over the S/D structures 136, and an interlayer dielectric (ILD) structure 140 is formed over the CESL 138. In some embodiments, the CESL 138 is formed to conformally cover the top surfaces of the S/D structures 136, and the CESL 138 extends over the sidewalls of the gate spacers 132' and the sidewalls of the hard mask layer 108'.

In some embodiments, the CESL 138 is made of a dielectric material, such as silicon nitride, silicon oxide, silicon oxynitride, another applicable dielectric material, or a combination thereof. In some embodiments, the CESL 138 is formed by CVD (such as PECVD, high aspect ratio process (HARP), or a combination thereof), ALD, another applicable method, or a combination thereof.

In some embodiments, the ILD structure 140 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), and polyimide. In addition, the ILD structure 140 may be formed by CVD, PVD, ALD, spin-on coating, or another applicable process.

Afterwards, a planarizing process is performed on the ILD structure 140 until the top surfaces of the dummy gate structures 122 are exposed, as shown in FIG. 1K in accordance with some embodiments. After the planarizing process, the top surfaces of the dummy gate structures 122 and the top surfaces of the gate spacers 132' may be substantially level with the ILD structure 140. In some embodiments, the planarizing process includes a grinding process, a chemical mechanical polishing (CMP) process, an etching process, another applicable process, or a combination thereof.

Next, the dummy gate structures 122 are removed to form trenches 142 in the ILD structure 140, as shown in FIGS. 1L and 2A in accordance with some embodiments. FIG. 2A is a cross-sectional representation taken along line I-I of FIG. 1L. More specifically, each of the trenches 142 is formed between each pair of the gate spacers 132', and the hard mask layer 108' is partially exposed by the trenches 142. In some embodiments, the dummy gate dielectric layer 118' and the dummy gate electrode layer 120 of the dummy gate structures 122 are removed by an etching process, such as a dry etching process or a wet etching process.

After the trenches 142 are formed, the etched first semiconductor layers 104" are removed to form gaps 144, as shown in FIGS. 1M and 2B in accordance with some embodiments. FIG. 2B is a cross-sectional representation taken along line I-I of FIG. 1M in accordance with some embodiments. In some embodiments, the removal process includes a selective etching process. The selective etching process removes the etched first semiconductor layers 104" and remains the second semiconductor layers 106' as "nanowires" used to form channel regions of the semiconductor device structure 100a, in accordance with some embodiments.

In some embodiments, the selective etching process of removing the etched first semiconductor layers 104" includes a wet etch process, a dry etch process, or a combination thereof. In some embodiments, the selective etching process is a plasma-free dry chemical etching process. In some embodiments, the etchant of the dry chemical etching process includes radicals, such as HF, NF$_3$, NH$_3$, H$_2$, or a combination thereof.

It should be noted that, in some embodiments, a portion of the hard mask layer 108' exposed by the trenches 142 is etched during the selective etching process of removing the etched first semiconductor layers 104" such that an etched hard mask layer 108" is obtained. In some embodiments, a height of the portion of the etched hard mask layer 108" directly below the gate spacers 132' is greater than a height of the portion of the etched hard mask layer 108" exposed by the trenches 142. In addition, the sidewalls of the second semiconductor layers 106' (i.e. the nanowires) are substantially aligned with the sidewalls of the etched hard mask layer 108", in accordance with some embodiments.

Moreover, some of the gaps 144 are formed between the etched hard mask layer 108" and the second semiconductor layers 106', and the others of the gaps 144 are formed between the second semiconductor layers 106', in accordance with some embodiments. In addition, in some embodiments, the gaps 144 are interposed between the inner spacers 134.

After the gaps 144 are formed, gate structures (or metal gate structures) 156 are formed surrounding the etched hard mask layer 108" and the second semiconductor layers 106', as shown in FIGS. 1N, 2C-1 and 2C-2, in accordance with some embodiments. FIG. 2C-1 is a cross-sectional representation taken along line I-I of FIG. 1N, and FIG. 2C-2 is a cross-sectional representation taken along line II-II of FIG. 1N, in accordance with some embodiments.

The gate structures 156 may be multi-layered structures. Each of the gate structures 156 includes an interfacial layer 146, a high-k dielectric layer 148, a work function layer 150, a gate electrode layer 152 and a metal cap layer 154, in accordance with some embodiments. In some embodiments, the second semiconductor layers 106' are surrounded and in direct contact with the interfacial layers 146, and the interfacial layers 146 are surrounded by the high-k dielectric layers 148. In some embodiments, the interfacial layers 146 are not formed surrounding the etched hard mask layer 108", and the etched hard mask layer 108" is surrounded and in direct contact with the high-k dielectric layers 148.

In some embodiments, the interfacial layers 146 are made of silicon oxide, and the interfacial layers are formed by thermal oxidation. In some embodiments, each of the high-k dielectric layers 148 is made of one or more layers of dielectric material, such as HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, another applicable high-k dielectric material, or a combination thereof. In some embodiments, the high-k dielectric layers 148 are formed by using CVD, ALD, another applicable method, or a combination thereof.

In addition, the high-k dielectric layers 148 are surrounded by the work function layers 150, and the gate electrode layers 152 are formed over the work function layers 150, in accordance with some embodiments. It should be noted that the gaps 144 below the etched hard mask layer 108" are filled by the interfacial layers 146, the high-k dielectric layers 148 and the work function layers 150, and the gate electrode layers 152 are not filled into the gaps 144 in accordance with some embodiments. Moreover, in some embodiments, the gate electrode layers 152 are not covered by the etched hard mask layer 108".

In some embodiments, the work function layers 150 are made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

In some embodiments, each of the gate electrode layers 152 is made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another applicable material, or a combination thereof. In some embodiments, the gate electrode layers 152 are formed by using CVD, ALD, electroplating, another applicable method, or a combination thereof.

In addition, the metal cap layers 154 are formed over the gate electrode layers 152, and hard mask layers 158 are formed over the metal cap layers 154 of the gate structures 156, as shown in FIGS. 1N, 2C-1 and 2C-2 in accordance with some embodiments.

In some embodiments, the metal cap layers 154 are made of tungsten (W), and/or another conductive metal material. In some embodiments, the metal cap layers 154 are formed by using CVD, HDPCVD, MOCVD, PECVD, another applicable process, or a combination thereof.

After the metal cap layers 154 are formed, the gate structures 156 are recessed (etched back) by an etching process, and the hard mask layers 158 are formed over the gate structures 156, in accordance with some embodiments.

In some embodiments, the hard mask layers 158 are made of oxide, silicon oxide, silicon nitride, silicon carbonitride (SiCN), silicon oxide carbonitride (SiOCN), SiLK, or a combination thereof. In some embodiments, the hard mask layers 158 are formed in a deposition process, such as a CVD process, an ALD process, or another applicable process. In addition, each of the hard mask layers 158 may be a single layer which is formed by a single deposition process, or multiple layers which are formed by multiple deposition processes.

More specifically, in some embodiments, the gate structures 156 are filled in the gaps 144 between the etched hard mask layer 108" and the second semiconductor layers 106', and the gate structures 156 are also filled in the gaps 144 between the second semiconductor layers 106'. The portions of the gate structures 156 between the second semiconductor layers 106' have a thickness $T_1$, and the portions of the gate structures 156 between the etched hard mask layer 108" and the second semiconductor layers 106' have a thickness $T_2$.

In some embodiments, since the etched hard mask layer 108" is formed over the second semiconductor layers 106 and the gate structures 156 extend between the etched hard mask layer 108" and the second semiconductor layers 106', the thickness $T_2$ is substantially the same as the thickness $T_1$.

In some embodiments, the thicknesses of the portions of the gate structures 156 surrounding the second semiconductor layers 106' (i.e. nanowires) and covered by the etched hard mask layer 108" are uniform (i.e. the thickness $T_1$ is substantially the same as the thickness $T_2$). Therefore, threshold voltage (Vt) variation of semiconductor devices may be decreased.

Furthermore, the second semiconductor layers 106' (i.e. nanowires) are covered by the etched hard mask layer 108". Therefore, the second semiconductor layers 106' may be protected from being etched or damaged during the multi-patterning process for forming the gate structures 156 in different regions of the semiconductor device.

Moreover, a portion of the etched hard mask layer 108" directly covered and surrounded by the gate structures 156 has a thickness $T_3$, and the second semiconductor layers 106' has a thickness $T_4$. In some embodiments, the thickness $T_3$ is substantially the same as the thickness $T_4$. In addition, another portion of the etched hard mask layer 108" directly covered by the gate spacers 132' has a thickness $T_5$, as shown in FIG. 2C-2. Since the hard mask layer 108' is partially etched during the process for forming the gaps 144, the thickness $T_5$ is greater than the thickness $T_3$, in accordance with some embodiments.

In some embodiments, the thickness $T_3$ is in a range from about 3 nm to about 10 nm, and the thickness $T_5$ is in a range from greater than 0 to about 30 nm. In some embodiments, a ratio of a thickness $T_3$ to a thickness $T_5$ is greater than or equal to about 0.1 and less than 1. If the aforementioned ratio is too small (i.e., less than 0.1), the thickness $T_3$ is too small (i.e., less than 3 nm), and the second semiconductor layers 106' may not be protected by the etched hard mask layer 108" during the multi-patterning process for forming the gate structures 156 in different regions of the semiconductor device structure. If the thickness $T_3$ is too large (i.e., greater than 10 nm), the overall height of the gate structures 156 may be increased, which reduce the performance of the semiconductor device. In addition, the thickness $T_5$ is 0 in accordance with some embodiments which will be described in detail later according to FIGS. 5A to 5D.

After the hard mask layers 158 are formed, portions of the CESL 138 and portions of the ILD structures 140 are removed to form contact openings, which expose the S/D structures 136. Afterwards, a silicide layer 160 is formed over the exposed surfaces of the S/D structures 136, and contacts 162 are formed over the silicide layer 160, as shown in FIG. 1O in accordance with some embodiments. More specifically, the silicide layer 160 is between the S/D structures 136 and the contacts 162. In some embodiments, the contacts 162 are electrically connected to the S/D structures 136 through the silicide layer 160. The silicide layer 160 may be used to reduce contact resistance (Rcsd) between the contacts 162 and the S/D structures 136.

In some embodiments, a barrier layer (not shown) is formed over the S/D structures 136 by a deposition process, and an annealing process is performed on the barrier layer to form the silicide layer 160. The barrier layer firstly may be U-shaped, and a bottom portion of the barrier layer may be reacted with the S/D structures 136 to form the silicide layer 160.

In some embodiments, the silicide layer 160 is made of cobalt silicide, titanium silicide, tantalum silicide, nickel silicide, copper silicide, tungsten silicide, molybdenum silicide, another applicable metal silicide, or a combination thereof. In some embodiments, the deposition process of the barrier layer includes a PVD process, an ALD process, or another applicable process. In some embodiments, the annealing process is performed at a temperature in a range from about 300° C. to about 800° C. After the annealing process, the unreacted portion of the barrier layer may be removed.

In some embodiments, the contacts 162 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the contacts 162 are formed by a deposition process, such as a CVD process, a PVD process, an ALD process, a plating process, or another applicable process. After the contacts 162 are formed, the semiconductor device structure 100a is obtained. In addition, the hard mask layer 108" has a length L, and the length L is substantially the same as a channel length of the semiconductor device structure 100a, as shown in FIG. 1O in accordance with some embodiments.

In the embodiments of the methods for forming the semiconductor device structure 100a, the hard mask layer 108' is formed over the fin structures 110 before the dummy gate structures 122 are formed. Therefore, the fin structures 110 may be protected during the heavy partial removal process for forming the dummy gate structures 122.

Moreover, in the embodiments of the semiconductor device structure 100a, since the second semiconductor layers 106' (i.e. nanowires) are covered by the etched hard mask layer 108", the thicknesses of the portions of the gate structures 156 surrounding the second semiconductor layers 106' may be uniform (i.e. the thickness $T_1$ is substantially the same as the thickness $T_2$). Therefore, threshold voltage (Vt) variation of semiconductor devices may be decreased, and the second semiconductor layers 106' may be protected from being etched or damaged during the multi-patterning process for forming the gate structures 156 in different regions of the semiconductor device.

FIGS. 3A to 3D are perspective representations of various stages of forming a semiconductor device structure 100b, in accordance with some embodiments of the disclosure. The steps for forming the semiconductor device structure 100b shown in FIGS. 3A to 3D may be similar to, or the same as, the steps for forming the semiconductor device structure 100a shown in FIGS. 1E, 1F, 1G and 1O, and the difference between them is that the portions of the hard mask layer 108' exposed by the dummy gate structures 122 are further recessed in FIG. 3A.

Figure 3A:
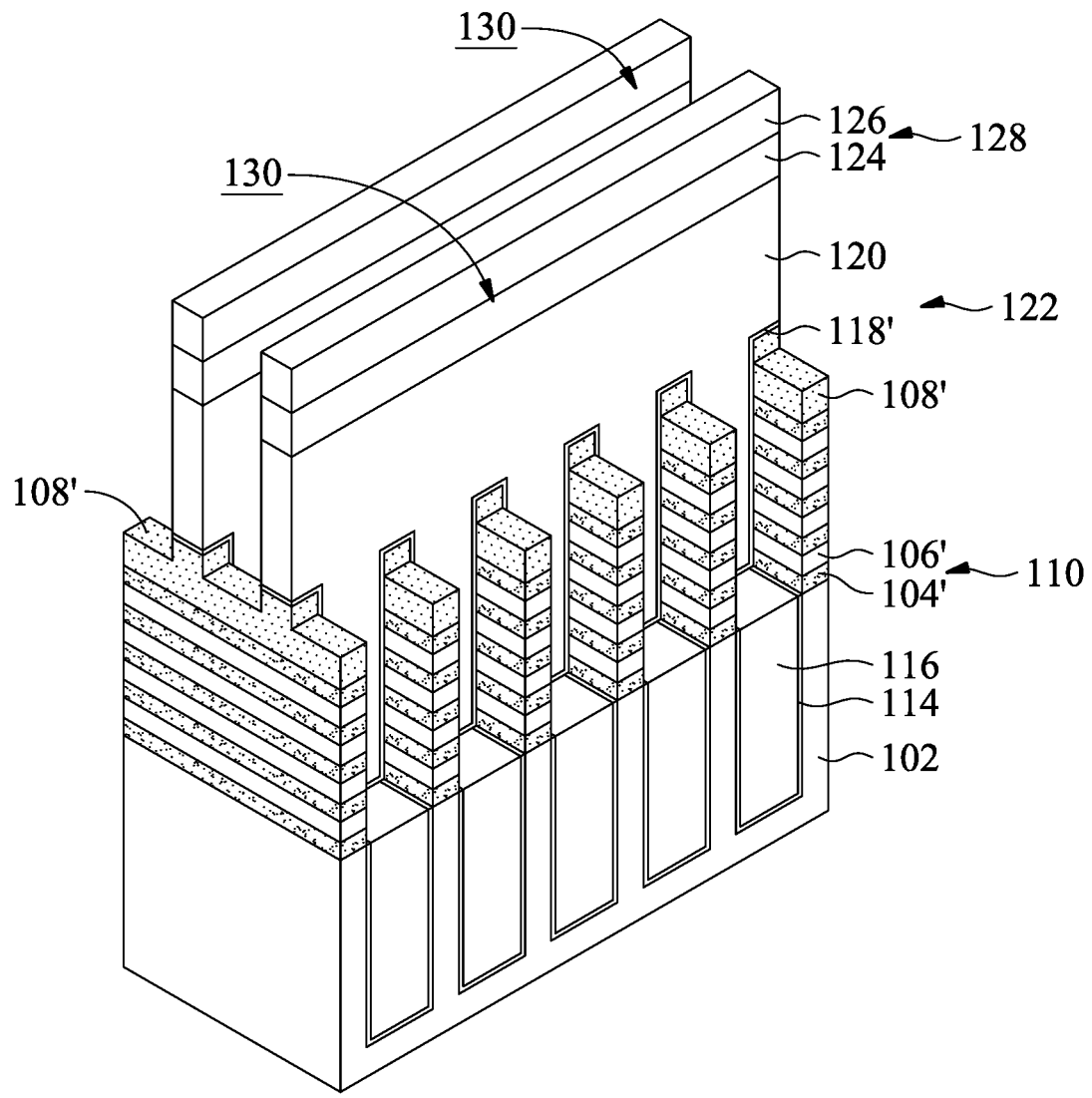
FIGS. 3A to 3D are perspective representations of various stages of forming a semiconductor device structure, in accordance with some embodiments of the disclosure.

In some embodiments, the portions of the hard mask layer 108' exposed by the dummy gate structures 122 are further recessed due to the heavy partial removal process for forming the dummy gate structures 122 as shown in FIG. 3A in accordance with some embodiments. As a result, the interfaces between the hard mask layer 108' and the dummy gate electrode layers 120 are higher than the top surfaces of the hard mask layer 108' exposed by the dummy gate structures 122 in accordance with some embodiments.

Figure 3B:
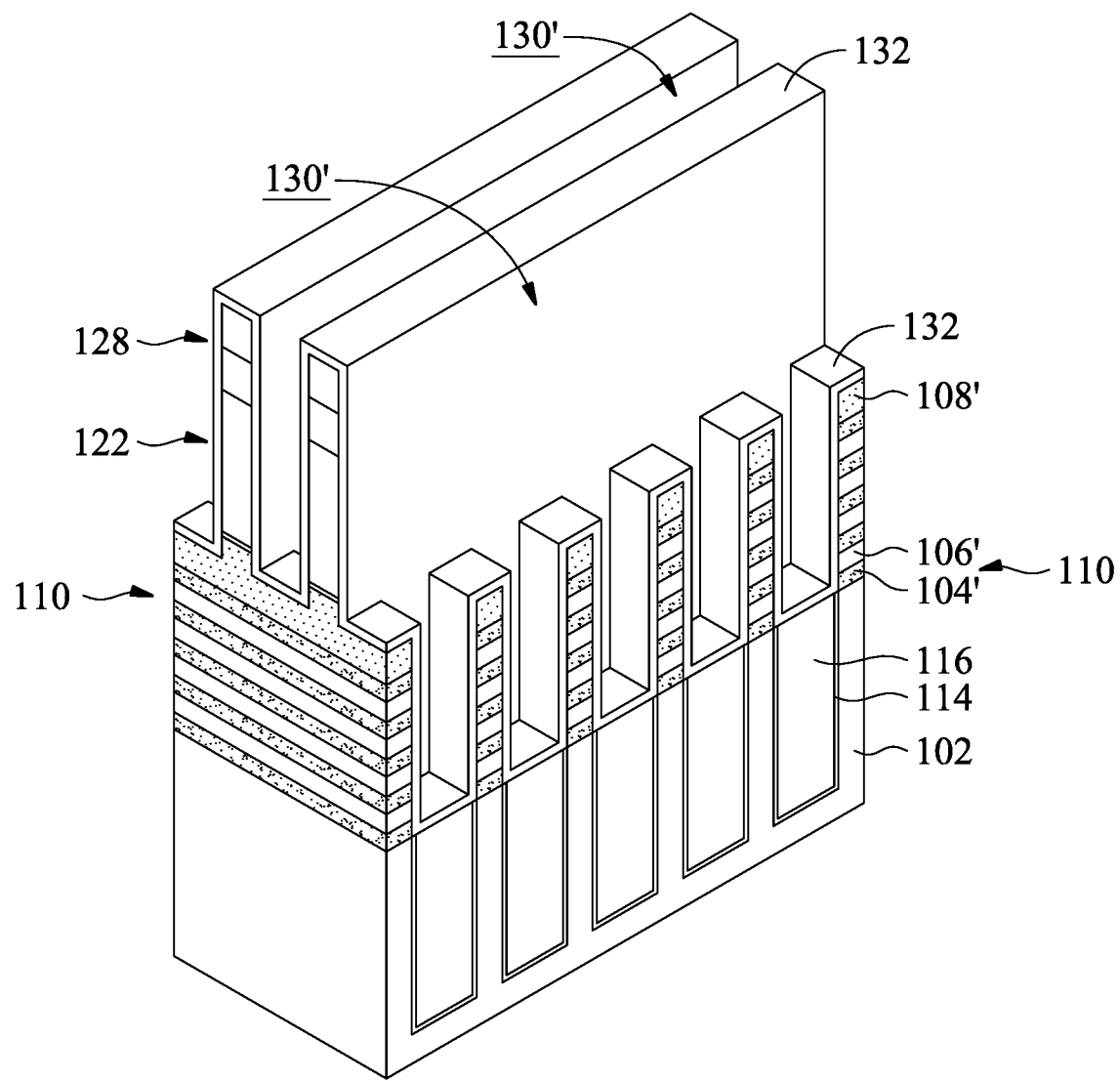
Figure 3C:
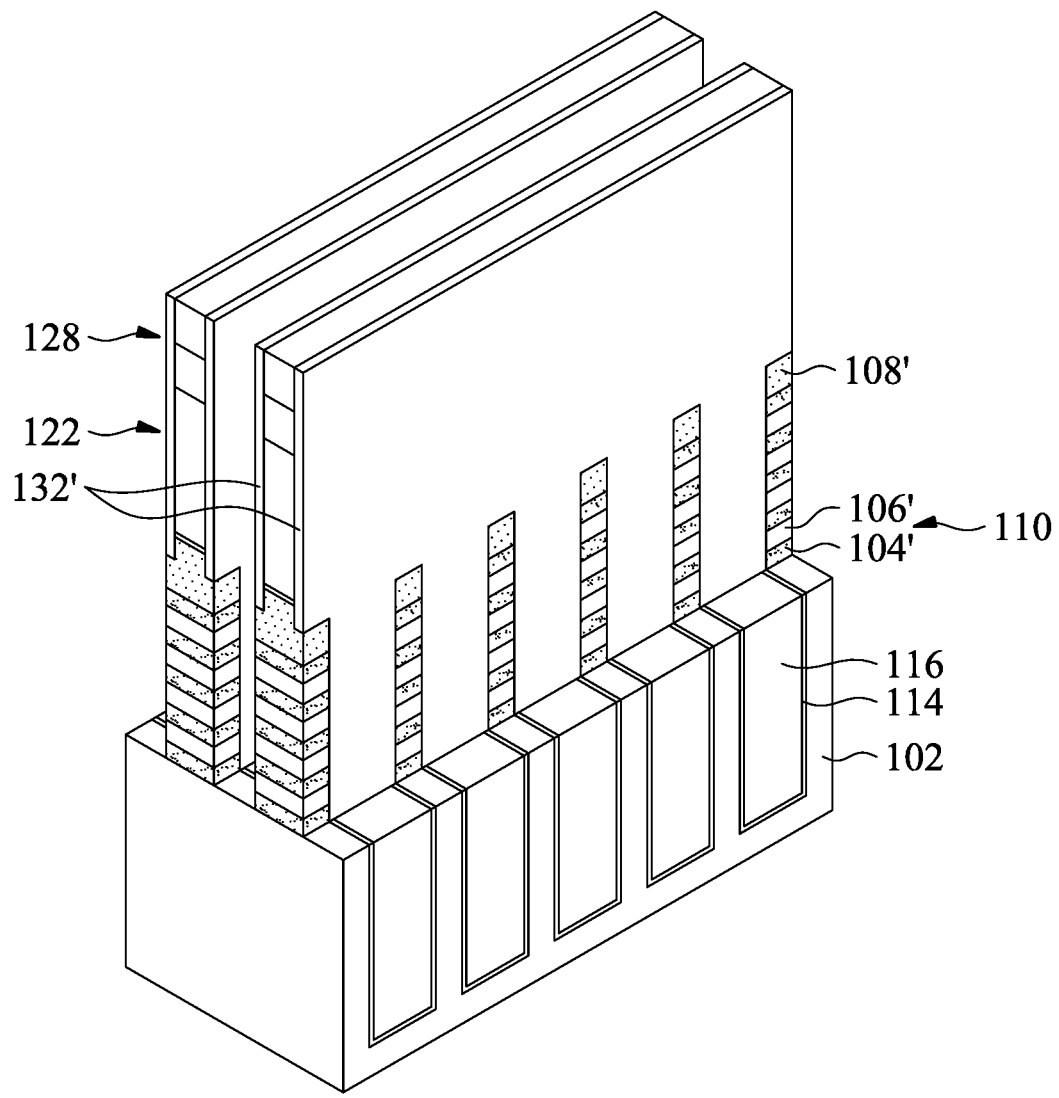

Afterwards, the further recessed top surfaces of the hard mask layer 108' are covered by the gate spacer layer 132, as shown in FIG. 3B in accordance with some embodiments. Next, pairs of gate spacers 132' over opposite sidewalls of the dummy gate structures 122 are formed from the gate spacer layer 132, and portions of fin structures 110 exposed by the dummy gate structures 122 and the gate spacers 132' are removed, as shown in FIG. 3C in accordance with some embodiments.

Figure 3D:
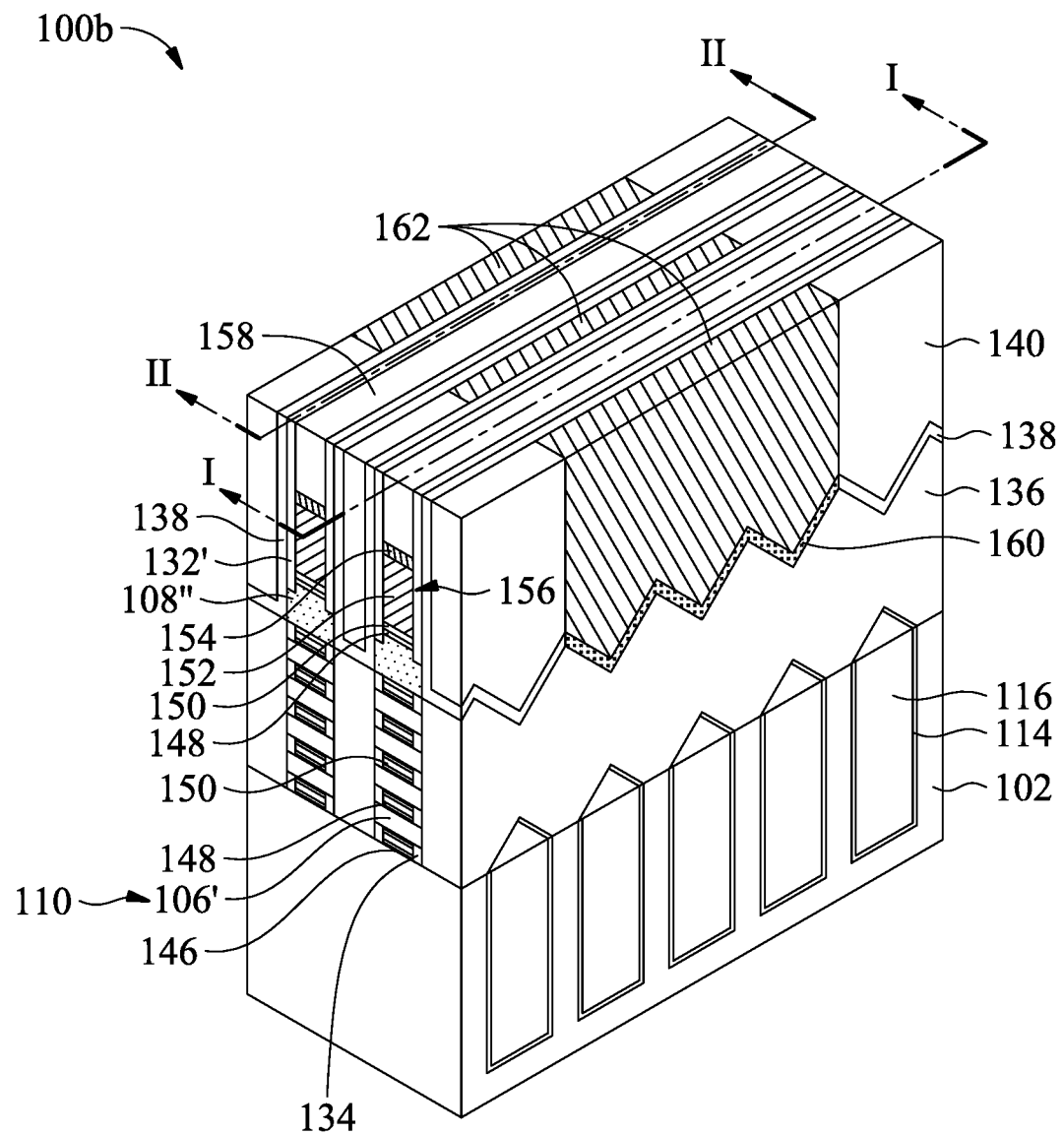

Afterwards, the subsequent processes for forming the semiconductor device structure 100b are similar to, or the same as, the processes for forming the semiconductor device structure 100a, and are not repeated herein, and the semiconductor device structure 100b is obtained as shown in FIG. 3D in accordance with some embodiments.

Figures 1, 4A:
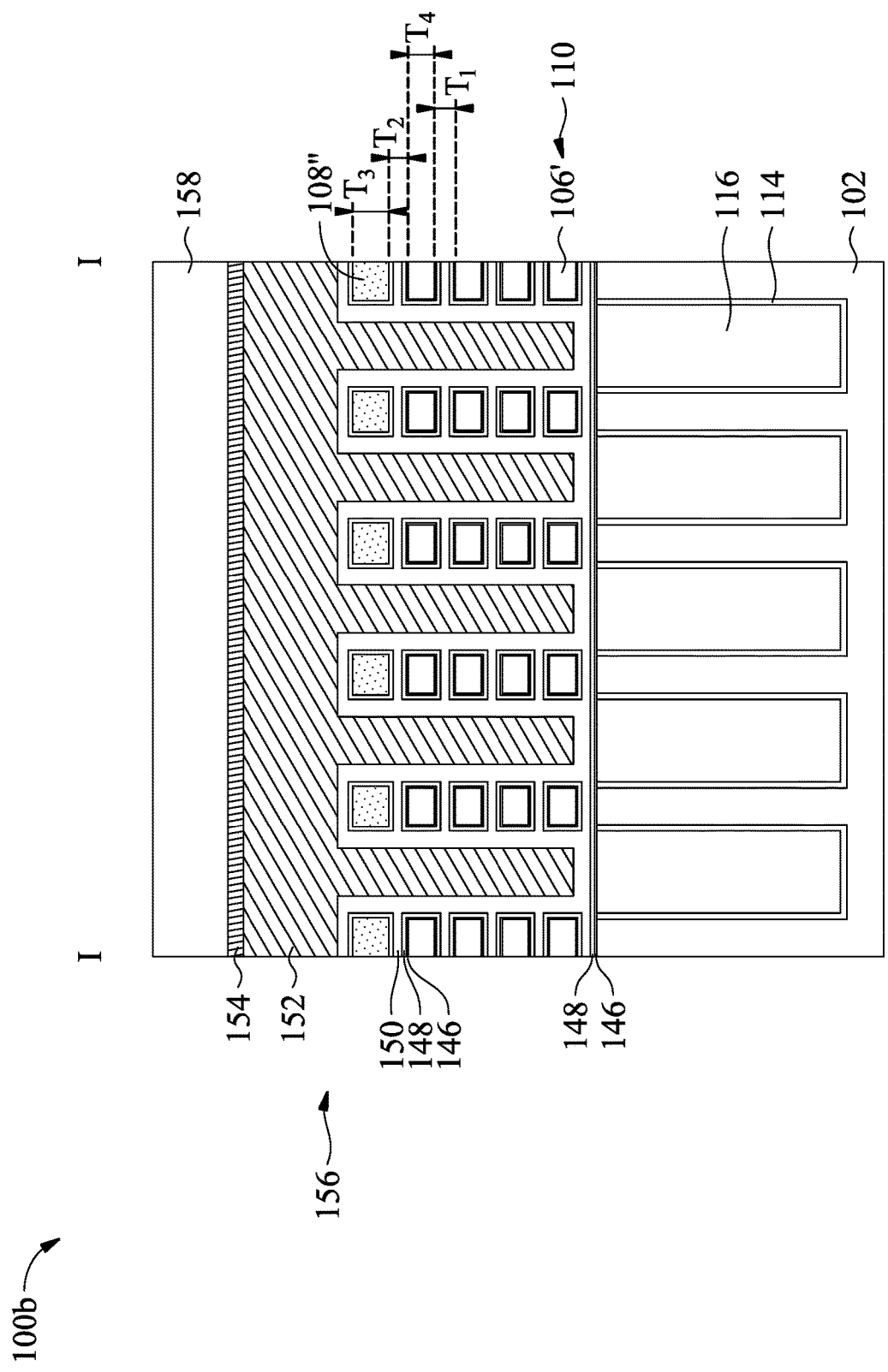
Figures 2, 4A:
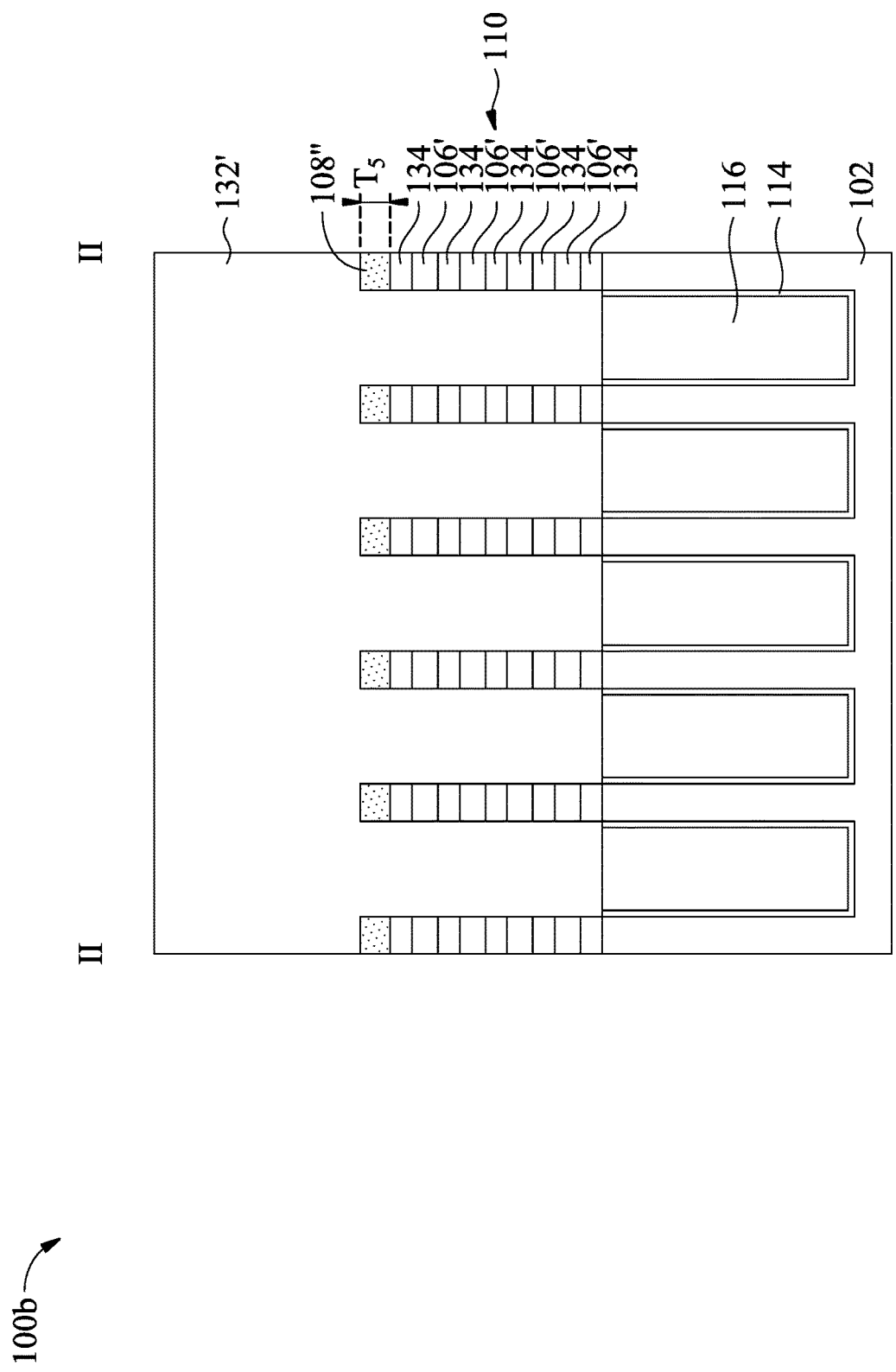

FIGS. 4A-1 and 4A-2 are cross-sectional representations of the semiconductor device structure 100b shown in FIG. 3D, in accordance with some embodiments of the disclosure. FIG. 4A-1 is a cross-sectional representation taken along line I-I of FIG. 3D, and FIG. 4A-2 is a cross-sectional representation taken along line II-II of FIG. 3D in accordance with some embodiments.

Although the portions of the hard mask layer 108' exposed by the trenches 142 are etched during the process for forming the gaps 144 between the second semiconductor layers 106', the portions of the hard mask layer 108' exposed by the dummy gate structures 122 may be further recessed due to the heavy partial removal process for forming the dummy gate structures 122 in the previous steps, and the recessed amount of the hard mask layer 108' for forming the dummy gate structures 122 may be greater than the etched amount of the hard mask layer 108' for forming the gaps 144 between the second semiconductor layers 106'. Therefore, the thickness $T_3$ surrounded by the gate structures 156 and directly below the gate electrode layers 152 is greater than the thickness $T_5$ directly below the gate spacers 132', in accordance with some embodiments.

In addition, since the thickness $T_2$ is substantially the same as the thickness $T_1$, the thicknesses of the portions of the gate structures 156 surrounding the second semiconductor layers 106' (i.e. nanowires) and covered by the etched hard mask layer 108" are uniform in accordance with some embodiments. Therefore, threshold voltage (Vt) variation of semiconductor devices may be decreased.

FIGS. 5A to 5D are perspective representations of various stages of forming a semiconductor device structure 100c, in accordance with some embodiments of the disclosure. The steps for forming the semiconductor device structure 100c shown in FIGS. 5A to 5D may be similar to, or the same as, the steps for forming the semiconductor device structure 100a shown in FIGS. 1E, 1F, 1G and 1O, and the difference between them is that the portions of the hard mask layer 108' exposed by the dummy gate structures 122 are entirely removed in FIG. 5A.

Figure 5A:
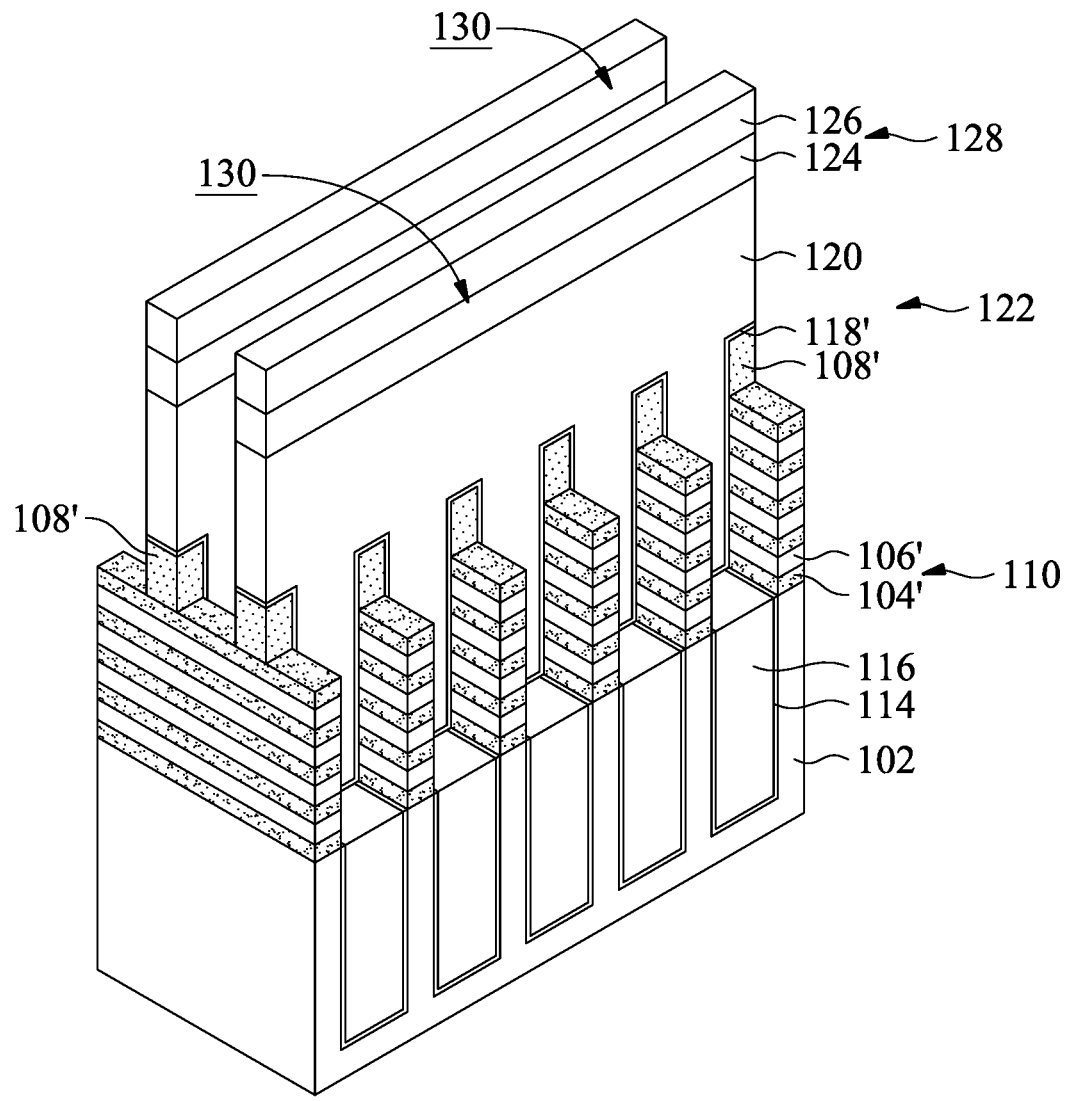
FIGS. 5A to 5D are perspective representations of various stages of forming a semiconductor device structure, in accordance with some embodiments of the disclosure.

In some embodiments, the portions of the hard mask layer 108' exposed by the dummy gate structures 122 are entirely removed due to the heavy partial removal process for forming the dummy gate structures 122 as shown in FIG. 5A in accordance with some embodiments. Therefore, the top surfaces of the first semiconductor layers 104' are partially exposed in accordance with some embodiments.

Figure 5B:
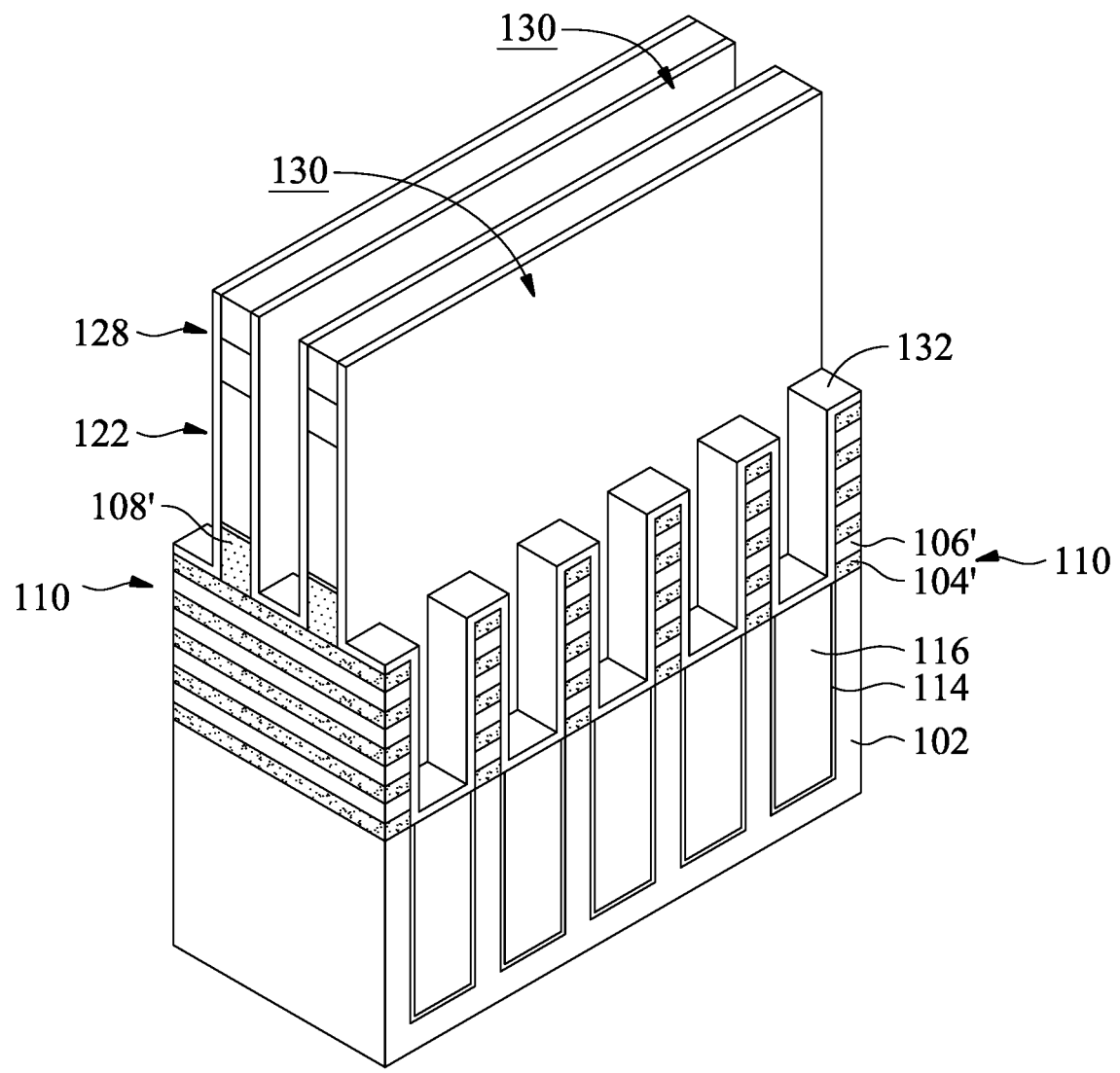
Figure 5C:
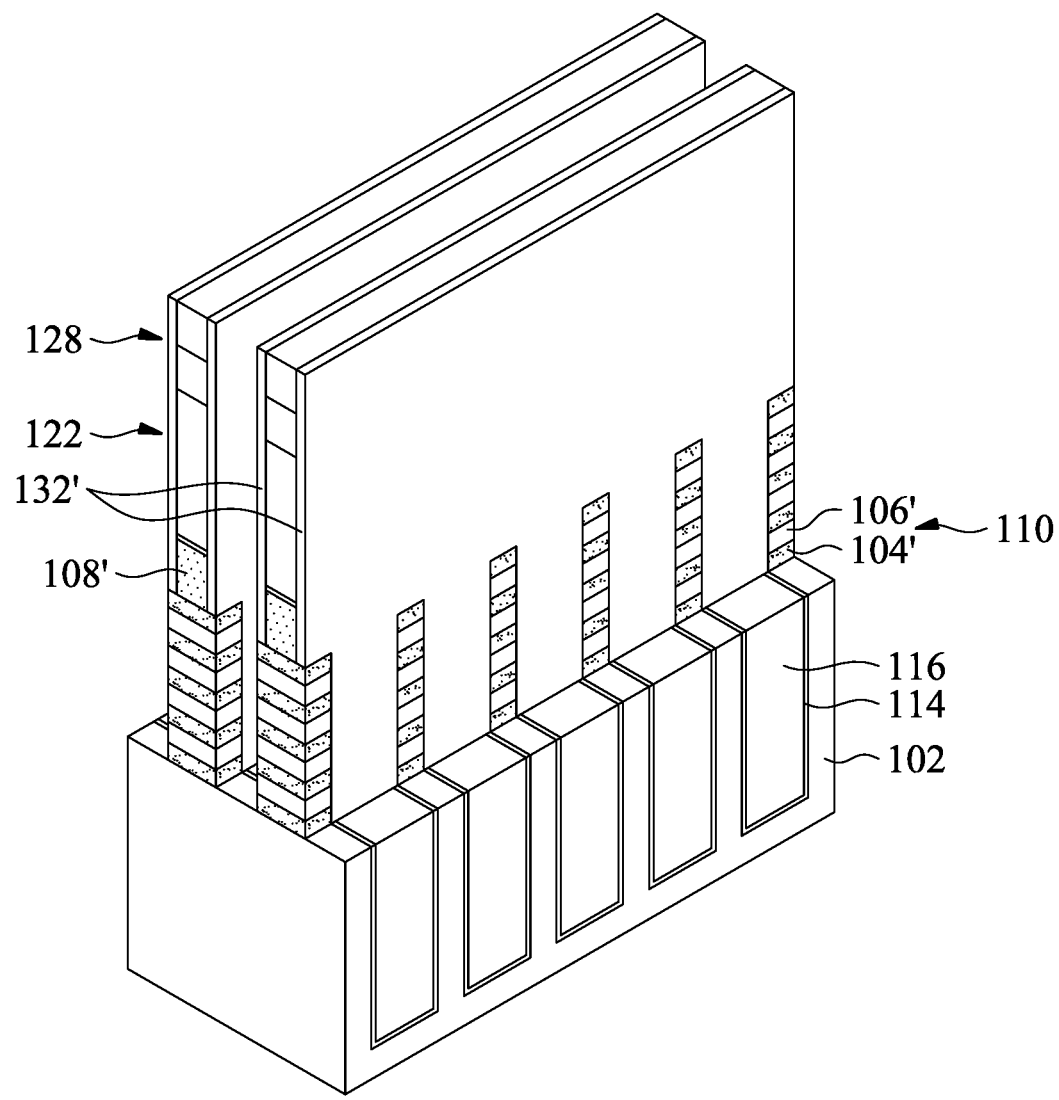

Afterwards, the top surfaces of the first semiconductor layers 104' are covered by the gate spacer layer 132, as shown in FIG. 5B in accordance with some embodiments. Next, pairs of gate spacers 132' over opposite sidewalls of the dummy gate structures 122 are formed from the gate spacer layer 132, and portions of fin structures 110 exposed by the dummy gate structures 122 and the gate spacers 132' are removed, as shown in FIG. 5C in accordance with some embodiments.

Figure 5D:
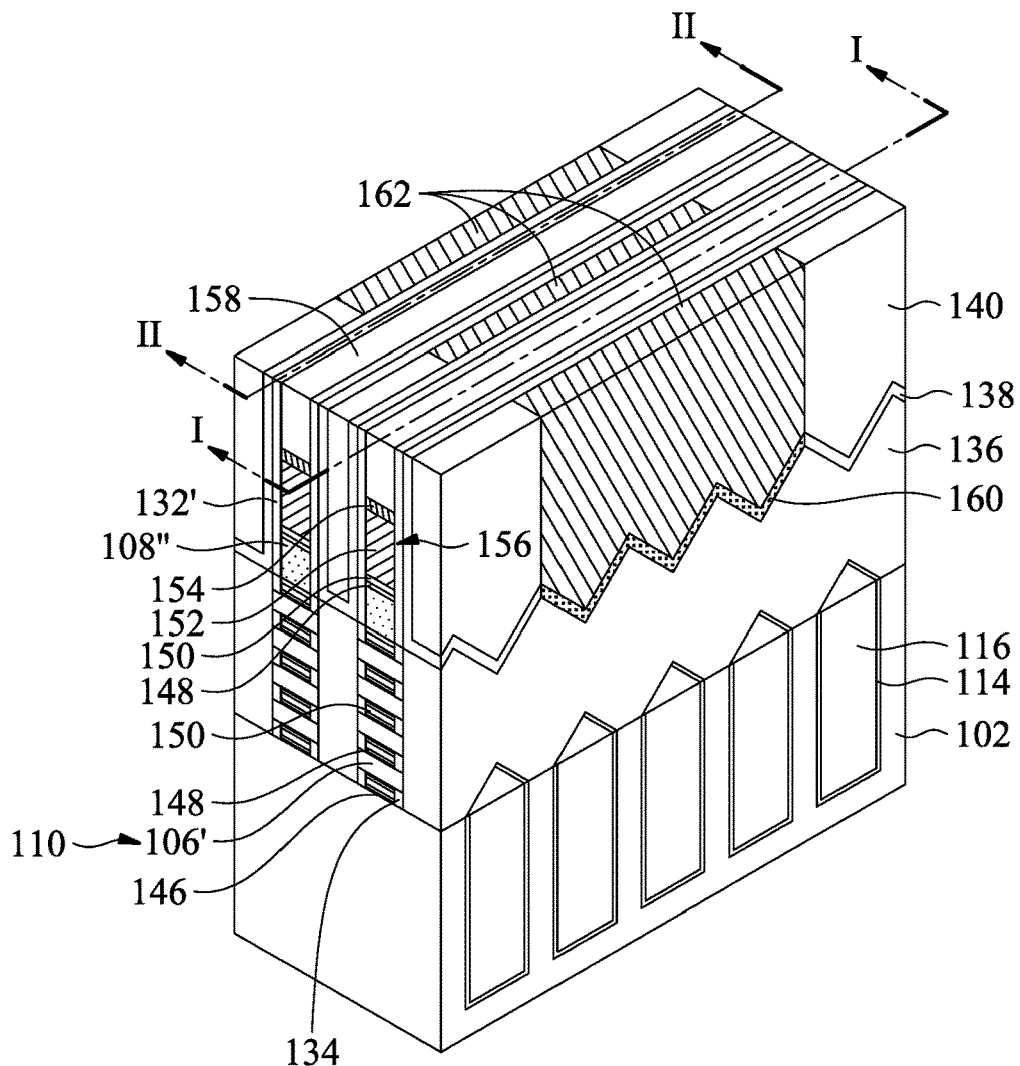

Afterwards, the subsequent processes for forming the semiconductor device structure 100c are similar to, or the same as, the processes for forming the semiconductor device structure 100a, and are not repeated herein, and the semiconductor device structure 100c is obtained as shown in FIG. 5D in accordance with some embodiments.

Figures 1, 6A:
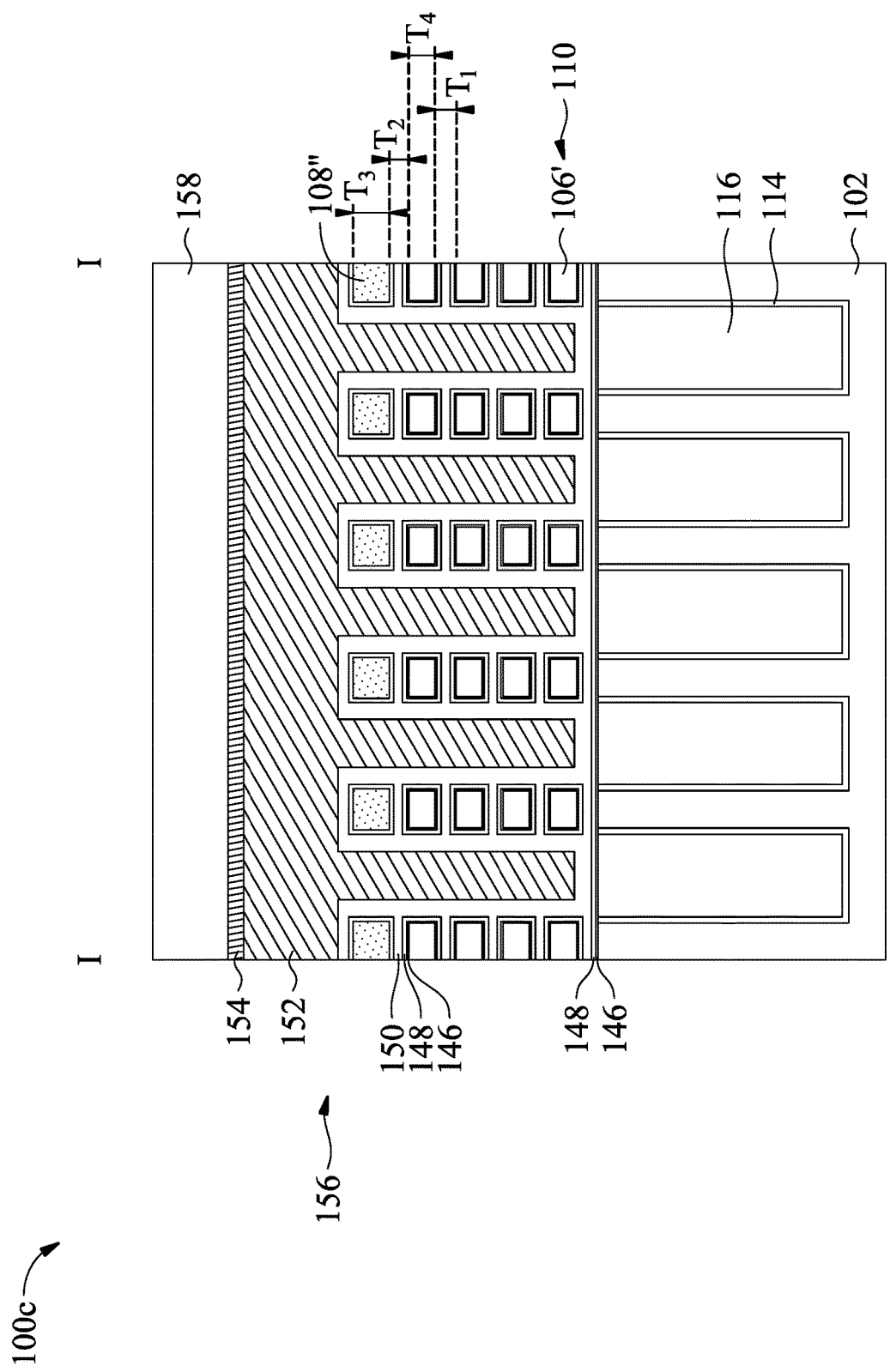
Figures 2, 6A:
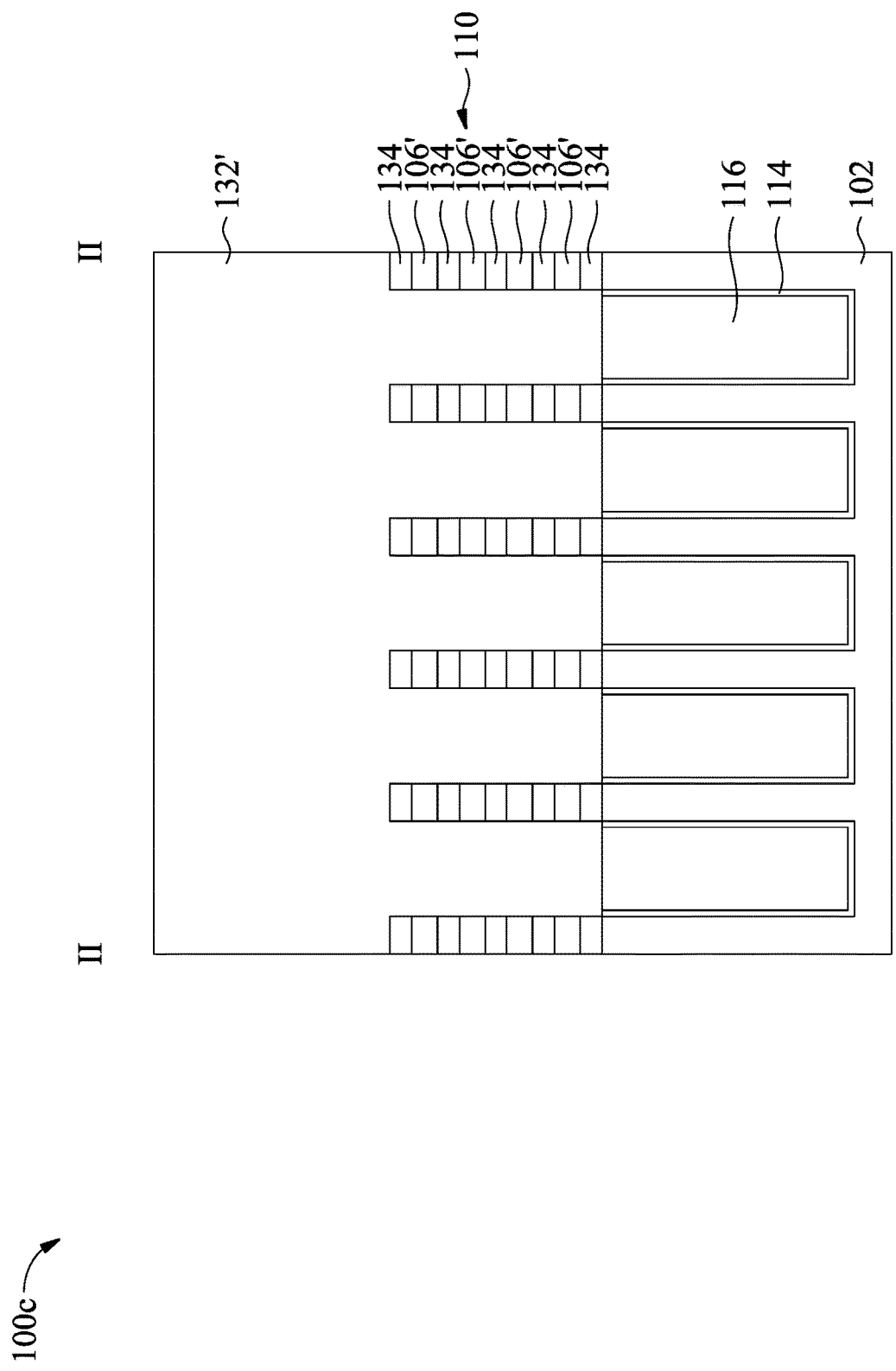

FIGS. 6A-1 and 6A-2 are cross-sectional representations of the semiconductor device structure 100c shown in FIG. 5D, in accordance with some embodiments of the disclosure. FIG. 6A-1 is a cross-sectional representation taken along line I-I of FIG. 5D, and FIG. 6A-2 is a cross-sectional representation taken along line II-II of FIG. 5D in accordance with some embodiments.

Since the portions of the hard mask layer 108' exposed by the dummy gate structures 122 are fully removed due to the heavy partial removal process for forming the dummy gate structures 122 in the previous steps, the hard mask layer 108' has no portions directly below the gate spacers 132', in accordance with some embodiments. In addition, the gate spacers 132' are in direct contact with the inner spacers 134, in accordance with some embodiments. Compared to the semiconductor device structures 100a and 100b in FIGS. 2C-2 and 4A-2, the etched hard mask layer 108" of the semiconductor device structure 100c has no thickness $T_5$ as shown in FIG. 6A-2, in accordance with some embodiments.

In the embodiments of the semiconductor device structures 100a, 100b and 100C (e.g. GAA structure), the fin structures 110 is covered by the etched hard mask layer 108", and therefore the fin structures 110 may be protected by the hard mask layer 108' during the heavy partial removal process for forming the dummy gate structures 122.

Moreover, since the second semiconductor layers 106' (i.e. nanowires) are covered by the etched hard mask layer 108" and the gate structures 156 extend between the etched hard mask layer 108" and the second semiconductor layers 106', the thickness of the portions of the gate structures 156 between the second semiconductor layers 106' and the thickness of the portions of the gate structures 156 between the second semiconductor layers 106' and the etched hard mask layer 108" can be uniform (i.e. the thickness $T_1$ is substantially the same as the thickness $T_2$). Therefore, threshold voltage (Vt) variation of semiconductor devices may be decreased, and the second semiconductor layers 106' may be protected from being etched or damaged during the multi-patterning process for forming the gate structures 156 in different regions of the semiconductor device.

Embodiments of a semiconductor device structure and methods for forming the same are provided. The semiconductor device structure may include a hard mask layer formed over a fin structure and a gate structure formed surrounding the hard mask layer and the fin structure, and a portion of the gate structure may be interposed between the fin structure and the hard mask layer. The hard mask layer may protect the fin structure during the formation of the gate structure. Therefore, threshold voltage (Vt) variation of semiconductor devices may be decreased, and the performances of the semiconductor devices may be increased.

In some embodiments, a semiconductor device structure is provided. The semiconductor device structure includes a fin structure formed over a substrate, and a hard mask layer formed over the fin structure. The semiconductor device structure also includes a gate structure formed surrounding the hard mask layer and the fin structure, and a portion of the gate structure is interposed between the fin structure and the hard mask layer. The semiconductor device structure further includes a source/drain (S/D) structure formed adjacent to the gate structure.

In some embodiments, a semiconductor device structure is provided. The semiconductor device structure includes a fin structure formed over a substrate. The fin structure includes a plurality of nanowires. The semiconductor device structure also includes a gate structure formed over the fin structure. A first portion of the gate structure extends between the plurality of nanowires. The semiconductor device structure further includes a source/drain (S/D) structure formed adjacent to the gate structure, and a dummy channel layer formed over the fin structure. The fin structure is separated from the dummy channel layer by a second portion of the gate structure.

In some embodiments, a method for forming a semiconductor device structure is provided. The method for forming a semiconductor device structure includes forming a fin structure over a substrate, wherein the fin structure includes a plurality of first semiconductor layers and a plurality of second semiconductor layers in an alternating manner. The method for forming a semiconductor device structure also includes forming a protection layer over a topmost layer of the plurality of first semiconductor layers, and forming a dummy gate structure over the protection layer. The method for forming a semiconductor device structure further includes forming gate spacers over sidewalls of the dummy gate structure, and removing the dummy gate structure and the plurality of first semiconductor layers to form a trench. In addition, the method for forming a semiconductor device structure includes forming a metal gate structure in the trench. The protection layer is surrounded by the metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a fin structure formed over a substrate;
    a hard mask layer formed over the fin structure;
    a gate structure formed surrounding the hard mask layer and the fin structure, and a portion of the gate structure is interposed between the fin structure and the hard mask layer;
    a source/drain (S/D) structure formed adjacent to the gate structure; and
    an inner spacer formed between the gate structure and the S/D structure, wherein the inner spacer is formed along a sidewall of the portion of the gate structure.

2. The semiconductor device structure as claimed in claim 1, wherein the gate structure further comprises:
    a high-k dielectric layer surrounding the hard mask layer and the fin structure; and
    a work function layer surrounding the high-k dielectric layer, wherein the hard mask layer and the fin structure are separated by the high-k dielectric layer and the work function layer.

3. The semiconductor device structure as claimed in claim 1, further comprising:
    a contact etch stop layer (CESL) formed over the S/D structure; and
    an inter-layer dielectric (ILD) structure formed over the CESL, wherein a sidewall of the hard mask layer is in direct contact with the CESL and the ILD structure.

4. The semiconductor device structure as claimed in claim 1, wherein sidewalls of the hard mask layer are substantially aligned with sidewalls of the fin structure.

5. The semiconductor device structure as claimed in claim 1, wherein a thickness of the hard mask layer is substantially the same as a thickness of the fin structure.

6. A semiconductor device structure, comprising:
    a plurality of channel structures stacked along a first direction over a substrate;
    a gate structure formed over the channel structures, wherein a first portion of the gate structure extends between the plurality of channel structures;
    a source/drain (S/D) structure formed adjacent to the gate structure;
    a dummy channel layer formed over the channel structures along the first direction, wherein the channel structures is separated from the dummy channel layer by a second portion of the gate structure;
    wherein the dummy channel layer is a hard mask layer comprising a dielectric material, and
    a contact etch stop layer (CESL) formed adjacent to and in direct contact with the dummy channel layer.

7. The semiconductor device structure as claimed in claim 6, wherein a thickness of the first portion of the gate structure between the plurality of channel structures is substantially the same as a thickness of the second portion of the gate structure.

8. The semiconductor device structure as claimed in claim 6, further comprising:
    an inner spacer formed between the second portion of the gate structure and the S/D structure, wherein the inner spacer is covered by the dummy channel layer.

9. The semiconductor device structure as claimed in claim 8, further comprising:
    a gate spacer formed over a sidewall of the gate structure, wherein the inner spacer and the gate spacer are separated by a first portion of the dummy channel layer.

10. The semiconductor device structure as claimed in claim 9, wherein a second portion of the dummy channel layer is directly above the second portion of the gate structure, and a height of the first portion of the dummy channel layer is different from a height of the second portion of the dummy channel layer.

11. The semiconductor device structure as claimed in claim 8, further comprising:
a gate spacer formed over a sidewall of the gate structure and a sidewall of the dummy channel layer, wherein the gate spacer is in direct contact with the inner spacer.

12. The semiconductor device structure as claimed in claim 6, wherein a length of the dummy channel layer is substantially the same as a channel length of the semiconductor device structure.

13. The semiconductor device structure as claimed in claim 6, wherein the dummy channel layer is in direct contact with a topmost surface of the inner spacer.

14. A semiconductor device structure, comprising:
a fin structure formed over a substrate, wherein the fin structure comprises a plurality of nanowires;
a hard mask layer formed over a topmost nanowires of the fin structure;
a gate structure surrounding the nanowires and the hard mask layer; and
a gate spacer layer formed adjacent to the gate structure, wherein the gate spacer layer is formed on and in direct contact with the hard mask layer, wherein a height of a first portion of the hard mask layer directly blow the gate spacer layer is greater than a height of a second portion of the hard mask layer directly below the gate structure.

15. The semiconductor device structure as claimed in claim 14, further comprising:
an inner spacer layer formed adjacent to the nanowires, wherein a portion of the inner spacer layer is in direct contact with the hard mask layer.

16. The semiconductor device structure as claimed in claim 15, further comprising:
a source/drain structure formed adjacent to the gate structure, wherein the inner spacer layer is between the gate structure and the source/drain structure.

17. The semiconductor device structure as claimed in claim 16, further comprising:
a contact etch stop layer (CESL) formed over the source/drain structure; and
a inter-layer dielectric layer formed over the CESL, wherein the hard mask layer is in direct contact with the CESL.

18. The semiconductor device structure as claimed in claim 14, wherein a thickness of the hard mask layer is substantially the same as a thickness of one of the nanowires.

19. The semiconductor device structure as claimed in claim 14, wherein a portion of the gate structure is between the nanowires and the hard mask layer.

20. The semiconductor device structure as claimed in claim 14, wherein a sidewall of the hard mask layer is substantially aligned with a sidewall of one of the nanowires.

* * * * *